United States Patent
Park et al.

(10) Patent No.: US 12,199,174 B2
(45) Date of Patent: Jan. 14, 2025

(54) HIGH ELECTRON MOBILITY TRANSISTOR AND METHOD OF MANUFACTURING THE SAME

(71) Applicant: Samsung Electronics Co., Ltd., Suwon-si (KR)

(72) Inventors: Junhyuk Park, Pohang-si (KR); Sunkyu Hwang, Seoul (KR); Jongseob Kim, Seoul (KR); Joonyong Kim, Seoul (KR); Woochul Jeon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 461 days.

(21) Appl. No.: 17/537,989

(22) Filed: Nov. 30, 2021

(65) Prior Publication Data
US 2022/0416070 A1 Dec. 29, 2022

(30) Foreign Application Priority Data
Jun. 25, 2021 (KR) .................. 10-2021-0083182

(51) Int. Cl.
*H01L 29/778* (2006.01)
*H01L 21/02* (2006.01)
(Continued)

(52) U.S. Cl.
CPC .... *H01L 29/7786* (2013.01); *H01L 21/02112* (2013.01); *H01L 21/022* (2013.01);
(Continued)

(58) Field of Classification Search
CPC ......... H01L 21/02315; H01L 21/02178; H01L 29/205; H01L 21/02112; H01L 29/66462;
(Continued)

(56) References Cited

U.S. PATENT DOCUMENTS

| 60,861 A | 1/1867 | Davenport |
| 7,052,942 B1 | 5/2006 | Smart et al. |

(Continued)

FOREIGN PATENT DOCUMENTS

| CN | 110061053 A | 7/2019 |
| CN | 111403481 A | 7/2020 |

(Continued)

OTHER PUBLICATIONS

Hsien-Chin Chiu et al., "Characterization of enhancement-mode AlGaN/GaN high electron mobility transistor using N2) plasma oxidation technology", Applied Physics Letters, 99, 153508 (2011).

*Primary Examiner* — Mouloucoulaye Inoussa
(74) *Attorney, Agent, or Firm* — Harness, Dickey & Pierce, P.L.C.

(57) ABSTRACT

The present disclosure provides a high electron mobility transistor including a channel layer; a barrier layer on the channel layer and configured to induce formation of a 2-dimensional electron gas (2DEG) to the channel layer; a p-type semiconductor layer on the barrier layer; a first passivation layer on the barrier layer and including a quaternary material of Al, Ga, O, and N; a gate electrode on the p-type semiconductor layer; and a source electrode and a drain electrode provided on both sides of the barrier layer and separated from the gate electrode.

20 Claims, 17 Drawing Sheets

(51) Int. Cl.
 *H01L 23/29* (2006.01)
 *H01L 23/31* (2006.01)
 *H01L 29/20* (2006.01)
 *H01L 29/205* (2006.01)
 *H01L 29/66* (2006.01)

(52) U.S. Cl.
 CPC .. *H01L 21/02241* (2013.01); *H01L 21/02315* (2013.01); *H01L 23/291* (2013.01); *H01L 23/3171* (2013.01); *H01L 23/3192* (2013.01); *H01L 29/2003* (2013.01); *H01L 29/205* (2013.01); *H01L 29/66462* (2013.01)

(58) Field of Classification Search
 CPC ........... H01L 21/02252; H01L 23/3192; H01L 23/3171; H01L 23/291; H01L 21/02241; H01L 21/02194; H01L 29/2003; H01L 29/42316; H01L 29/1066; H01L 29/7786; H01L 21/022; H01L 29/41766; H01L 21/28587; H01L 21/765; H01L 21/0217; H01L 29/404; H01L 21/02164; H01L 29/475; H01L 21/0214; H01L 29/7787; H01L 21/28264; H01L 29/408; H01L 21/28581; H01L 29/0657; H01L 29/66212; H01L 29/8083; H01L 29/0619; H01L 29/66909; H01L 29/872; H01L 29/207; H01L 29/452; H01L 2224/05553; H01L 2924/12032; H01L 2224/0603; H01L 2924/181; H01L 2224/48472; H01L 2224/48245; H01L 2224/48247; H01L 2924/00012
 USPC ........... 257/76, 194, 355, E21.403, E29.089; 438/172
 See application file for complete search history.

(56) References Cited

U.S. PATENT DOCUMENTS

| | | | |
|---|---|---|---|
| 2007/0114569 A1* | 5/2007 | Wu | H01L 29/207 257/E29.093 |
| 2010/0025730 A1* | 2/2010 | Heikman | H01L 29/402 257/E21.403 |
| 2012/0235160 A1* | 9/2012 | Heikman | H01L 29/402 257/E29.246 |
| 2013/0062666 A1* | 3/2013 | Imada | H01L 29/66462 257/E29.05 |
| 2013/0193485 A1* | 8/2013 | Akiyama | H01L 29/66462 257/194 |
| 2014/0001478 A1* | 1/2014 | Saunier | H01L 29/7786 257/E21.403 |
| 2014/0151749 A1* | 6/2014 | Jeon | H01L 29/7786 257/194 |
| 2015/0060861 A1 | 3/2015 | Chiu et al. | |
| 2016/0372557 A1* | 12/2016 | Liao | H01L 29/404 |
| 2017/0062581 A1* | 3/2017 | You | H01L 29/66462 |
| 2018/0233577 A1* | 8/2018 | You | H01L 29/66462 |
| 2018/0308968 A1* | 10/2018 | Miura | H01L 21/02381 |
| 2019/0280092 A1* | 9/2019 | Lin | H01L 29/408 |
| 2021/0043781 A1 | 2/2021 | Shinohara | |
| 2021/0074655 A1 | 3/2021 | Zandipour et al. | |
| 2021/0184010 A1* | 6/2021 | Chong | H01L 29/42316 |
| 2021/0336016 A1* | 10/2021 | Hsieh | H01L 21/02164 |
| 2022/0102543 A1* | 3/2022 | Otake | H01L 29/7786 |
| 2022/0165875 A1* | 5/2022 | Otake | H01L 29/66462 |
| 2023/0207661 A1* | 6/2023 | Hoshi | H01L 29/2003 257/183 |
| 2023/0387203 A1 | 11/2023 | Chen et al. | |
| 2023/0411507 A1* | 12/2023 | Chen | H01L 29/7783 |
| 2024/0030331 A1* | 1/2024 | Liu | H01L 29/7786 |
| 2024/0186423 A1 | 6/2024 | Zhou et al. | |

FOREIGN PATENT DOCUMENTS

| | | |
|---|---|---|
| CN | 112086362 A | 12/2020 |
| KR | 10-0969608 B1 | 7/2010 |

* cited by examiner

HIGH ELECTRON MOBILITY TRANSISTOR AND METHOD OF MANUFACTURING THE SAME

CROSS-REFERENCE TO RELATED APPLICATION

This application is based on and claims priority under 35 U.S.C. § 119 to Korean Patent Application No. 10-2021-0083182, filed on Jun. 25, 2021, in the Korean Intellectual Property Office, the disclosure of which is incorporated by reference herein in its entirety.

BACKGROUND

1. Field

The present disclosure relates to high electron mobility transistors and methods of manufacturing the same, and more particularly, to high electron mobility transistors including a passivation layer of a quaternary material and methods of manufacturing the same.

2. Description of the Related Art

In various power conversion systems, a device that controls the flow of current through ON/OFF switching, that is, a power device, is required. In a power conversion system, the efficiency of a power device may influence the efficiency of the entire system.

Currently commercialized power devices are mostly power metal-oxide-semiconductor field-effect transistors (MOSFETs) or insulated gate bipolar transistors (IGBTs) based on Silicon (SI). However, due to the physical limit of silicon and the limitation of the manufacturing process, it is difficult to increase the efficiency of a power device based on silicon. In order to overcome such limitations, research and development has been conducted to increase the conversion efficiency of a power conversion system by applying Group III-V series compound semiconductors to a power device. In this regard, a high electron mobility transistor (hereinafter, a HEMT) using a heterojunction structure of a compound semiconductor has drawn attention.

A HEMT includes semiconductor layers with different electrical polarization characteristics. In a HEMT, a semiconductor layer having a relatively large polarization may induce formation of a 2-dimensional electron gas (hereinafter, a 2DEG) in another semiconductor layer heterojunctioned therewith. The 2DEG is used as a channel between a drain electrode and a source electrode, and a current flowing through the channel is controlled by a bias voltage applied to a gate electrode. A HEMT of a typical structure, for example, a HEMT using a heterojunction by a Group III nitride semiconductor, has a normally-on characteristic. In order to implement a HEMT of a normally-off characteristic, a semiconductor layer forming a depletion region is employed in a channel.

SUMMARY

Provided are high electron mobility transistors including a passivation layer of a quaternary material provided on a barrier layer and methods of manufacturing the same.

Additional aspects will be set forth in part in the description which follows and, in part, will be apparent from the description, or may be learned by practice of the presented embodiments of the disclosure.

According to an embodiment, a high electron mobility transistor includes: a channel layer; a barrier layer on the channel layer and configured to induce formation of a two-dimensional electron gas (2DEG) in the channel layer; a p-type semiconductor layer on the barrier layer; a first passivation layer on the barrier layer and including a quaternary material of Al, Ga, O, and N; a gate electrode on the p-type semiconductor layer; and a source electrode and a drain electrode on both sides of the barrier layer, respectively, and separated from the gate electrode.

In some embodiments, the first passivation layer may include $AlGaO_xN_y$ ($0<x<1$, $0<y<1$, and $x+y<1$).

In some embodiments, the first passivation layer may be on a region of the barrier layer where the p-type semiconductor layer of the barrier layer is not provided.

In some embodiments, the first passivation layer may be in direct contact with an upper surface of the barrier layer.

In some embodiments, the high electron mobility transistor may further include a second passivation layer covering the first passivation layer and the gate electrode.

In some embodiments, the second passivation layer may include a material different from that of the first passivation layer.

In some embodiments, the high electron mobility transistor may further include a third passivation layer covering the second passivation layer, the source electrode, and the drain electrode.

In some embodiments, the second passivation layer and the third passivation layer respectively may include a first hole and a second hole exposing the gate electrode to outside.

In some embodiments, an area of a lower surface of the gate electrode in contact with the p-type semiconductor layer may be less than an area of an upper surface of the p-type semiconductor layer in contact with the gate electrode.

In some embodiments, the first passivation layer may have a thickness in a range from about 1 nm to about 10 nm.

In some embodiments, an energy bandgap of the barrier layer may be greater than that of the channel layer.

In some embodiments, the barrier layer may include any one of AlGaN, AlInN, InGaN, AlN, and AlInGaN.

According to an embodiment, a method of manufacturing a high electron mobility transistor includes: forming a channel layer on a substrate; forming a barrier layer on the channel layer; forming a p-type semiconductor layer on the barrier layer; forming a first passivation layer including a quaternary material of Al, Ga, O, and N on the barrier layer; forming a gate electrode on the p-type semiconductor layer; and forming a source electrode and a drain electrode on both sides of the barrier layer, respectively, and separated from the gate electrode.

In some embodiments, in the forming the p-type semiconductor layer on the barrier layer and the forming a gate electrode on the p-type semiconductor layer, after sequentially forming a p-type semiconductor material layer and a gate electrode material layer on the barrier layer, the p-type semiconductor layer and the gate electrode may be formed by etching a stack of the p-type semiconductor material layer and the gate electrode material layer.

In some embodiments, the first passivation layer may be performed after the forming the p-type semiconductor layer and the forming the gate electrode.

In some embodiments, in the forming the first passivation layer, the first passivation layer may be formed by performing any one of an $O_2$ plasma pretreatment, an $N_2O$ plasma pretreatment, and an ozone treatment on the barrier layer exposed by etching the p-type semiconductor material layer and the gate electrode material layer.

In some embodiments, the method may further include forming a second passivation layer covering the first passivation layer and the gate electrode after the forming the first passivation layer.

In some embodiments, in the forming the p-type semiconductor layer on the barrier layer, a p-type semiconductor material layer may be formed on the barrier layer, and then the p-type semiconductor layer may be formed by etching the p-type semiconductor material layer.

In some embodiments, in the forming the first passivation layer, the first passivation may be formed by performing any one of an $O_2$ plasma pretreatment, an $N_2O$ plasma pretreatment, and an ozone treatment on the barrier layer exposed by etching the p-type semiconductor material layer.

In some embodiments, the method may further include, after the forming the first passivation layer and before the forming the gate electrode, forming a second passivation layer covering the first passivation layer and the p-type semiconductor layer.

In some embodiments, after the forming the second passivation layer and before the forming the gate electrode, the forming the source electrode and the drain electrode may be performed, In some embodiments, the method may further include forming a third passivation layer covering the source electrode, the drain electrode, and the second passivation layer. The forming the third passivation layer may be performed after the forming the source electrode and the forming the drain electrode and before the forming the gate electrode.

In some embodiments, in the forming the gate electrode, a first hole and a second hole for exposing the p-type semiconductor layer may be formed in the second passivation layer and the third passivation layer, respectively, and the gate electrode in contact with the p-type semiconductor layer through the first hole and the second hole may be formed.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
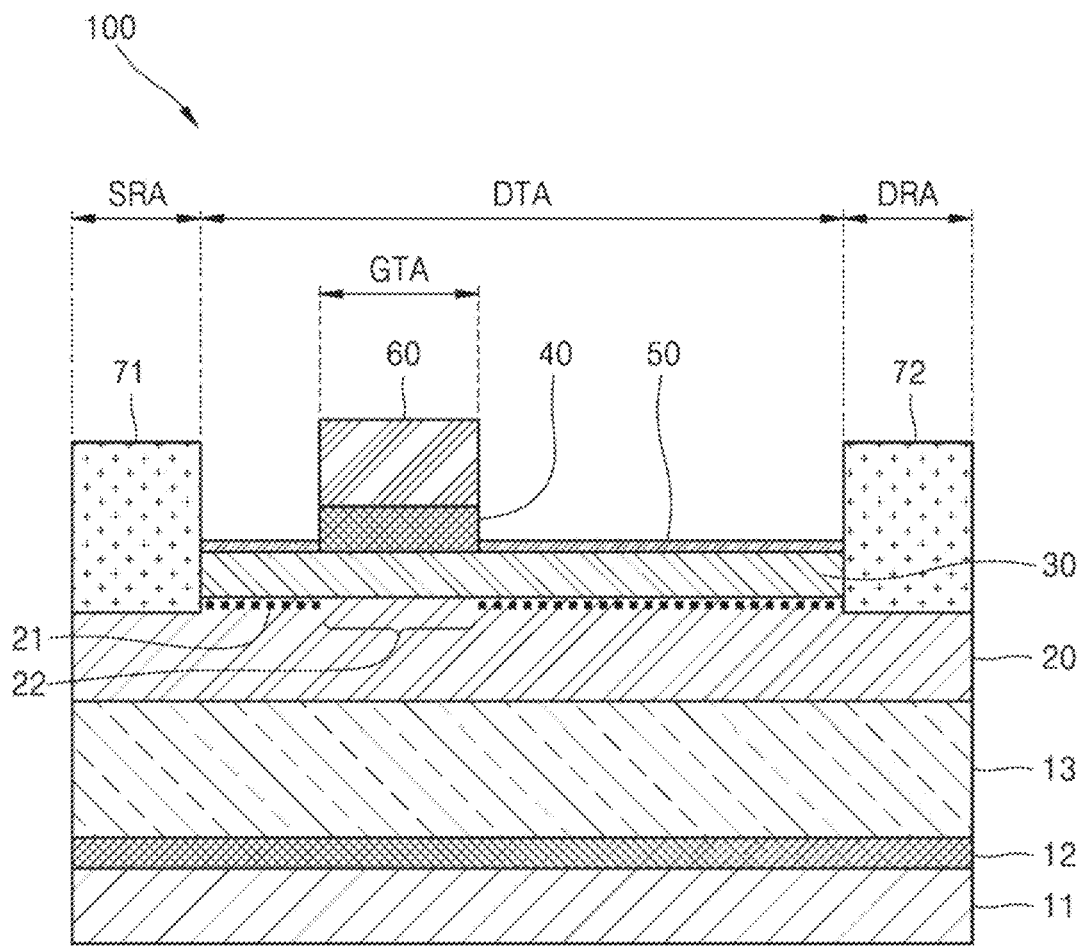
FIG. 1 is a schematic side cross-sectional view of a configuration of a high electron mobility transistor according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the drawings, sizes or thicknesses of constituent elements may be exaggerated for clarity of description. When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Although the terms "first", "second", etc. may be used herein to describe various constituent elements, but the elements should not be limited by these terms. These terms are only used to distinguish one element from another element.

When an element or layer is referred to as being "on" or "above" another element or layer, the element or layer may be directly on another element or layer or intervening elements or layers. The singular forms are intended to include the plural forms as well, unless the context clearly indicates otherwise.

In the entire specification, when a part "comprises" or "includes" an element, unless otherwise defined, other elements are not excluded from the part and the part may further include other elements.

In the specification, the term "above" and similar directional terms may be applied to both singular and plural.

Operations of all methods described herein may be performed in any suitable order unless otherwise indicated herein or otherwise clearly contradicted by context. The use of any and all examples, or exemplary language (e.g., "such as") provided herein, is intended merely to better illuminate the inventive concept and does not pose a limitation on the scope of the inventive concept unless otherwise claimed.

A semiconductor integrated circuit device may include two or more devices. For example, a semiconductor integrated circuit device may include two or more high electron mobility transistors (HEMTs). A high electron mobility transistor HEMT may include semiconductor layers having different electrical polarization characteristics. In a HEMT, a semiconductor layer having a relatively large polarizability may induce formation of a two-dimensional electron gas (2DEG) in another semiconductor layer heterojunctioned therewith, and such 2DEG may have very high electron mobility. When a gate voltage is 0V in a HEMT, if the HEMT is in a normally-on state wherein a current flows due to a low resistance between a drain electrode and a source electrode, current and power consumption of the HEMT may occur, and, in order to make an off-current state between the drain electrode and the source electrode, there is a problem that a negative voltage should be applied to the gate electrode. As a solution to these problems, a depletion forming layer may be provided to the HEMT to achieve a normally-off characteristic wherein, when a gate voltage is 0V, a current between the drain electrode and the source electrode is in an off-state. The depletion forming layer may include, for example, a p-type semiconductor layer.

In a process of forming a p-type semiconductor layer, dangling bonds and nitrogen vacancy defects may be generated on a surface of the HEMT, and as a result, the efficiency of the HEMT may be reduced. In order to remove the dangling bond, a passivation layer including SiN or the like may be formed on the HEMT. However, in a process of depositing a passivation layer including SiN, etc., an Mg—H complex is formed by reacting $H_2$ with magnesium (Mg) included in the p-type semiconductor layer, and thus, a hole concentration of the p-type semiconductor layer may be reduced.

Hereinafter, with reference to FIGS. 1 to 23, a high electron mobility transistor including a passivation layer including a quaternary material that suppresses the generation of a dangling bond that may be generated in a process of forming the high electron mobility transistor and does not cause a decrease in the hole concentration of a p-type semiconductor layer and a method of manufacturing the same will be described.

Figure 2:
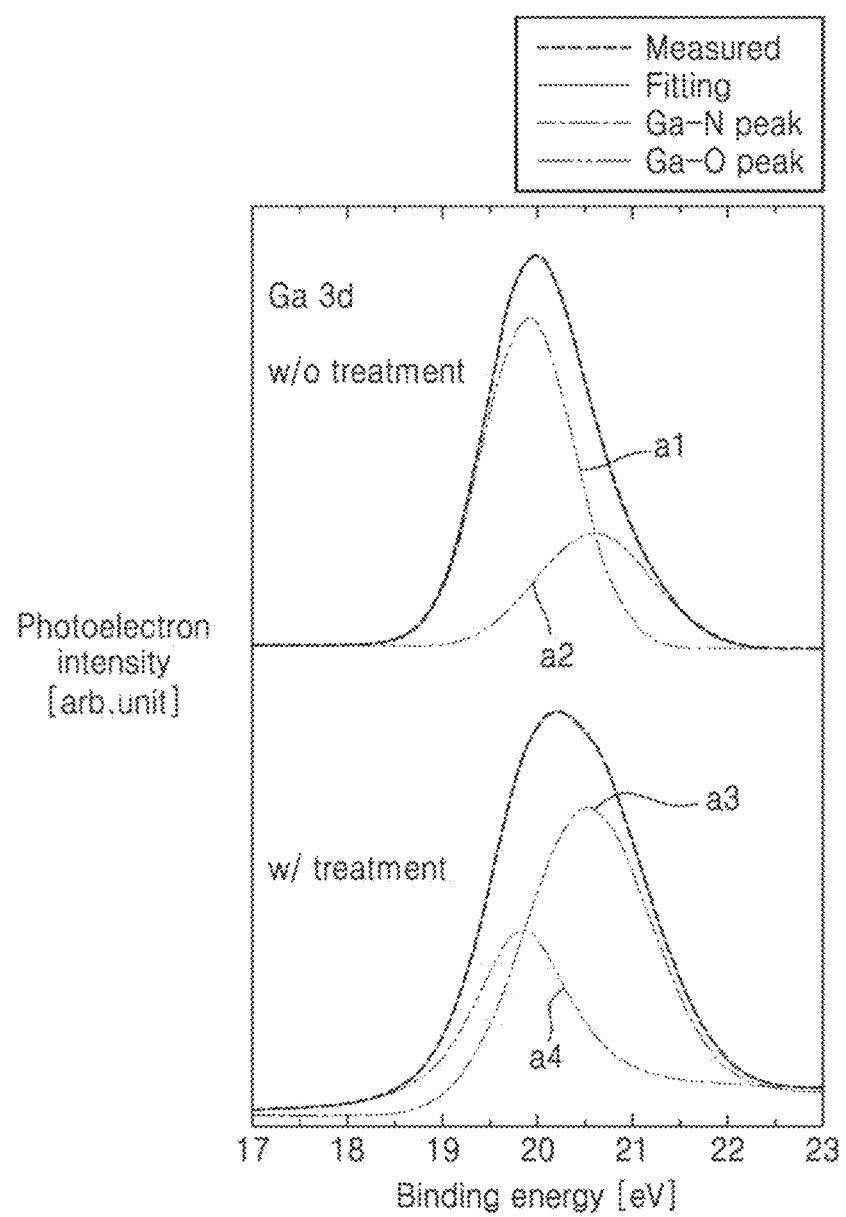
FIG. 2 is a graph schematically illustrating an X-ray photoelectron spectroscopy (XPS) result with respect to a high electron mobility transistor according to an embodiment.
Figure 3:
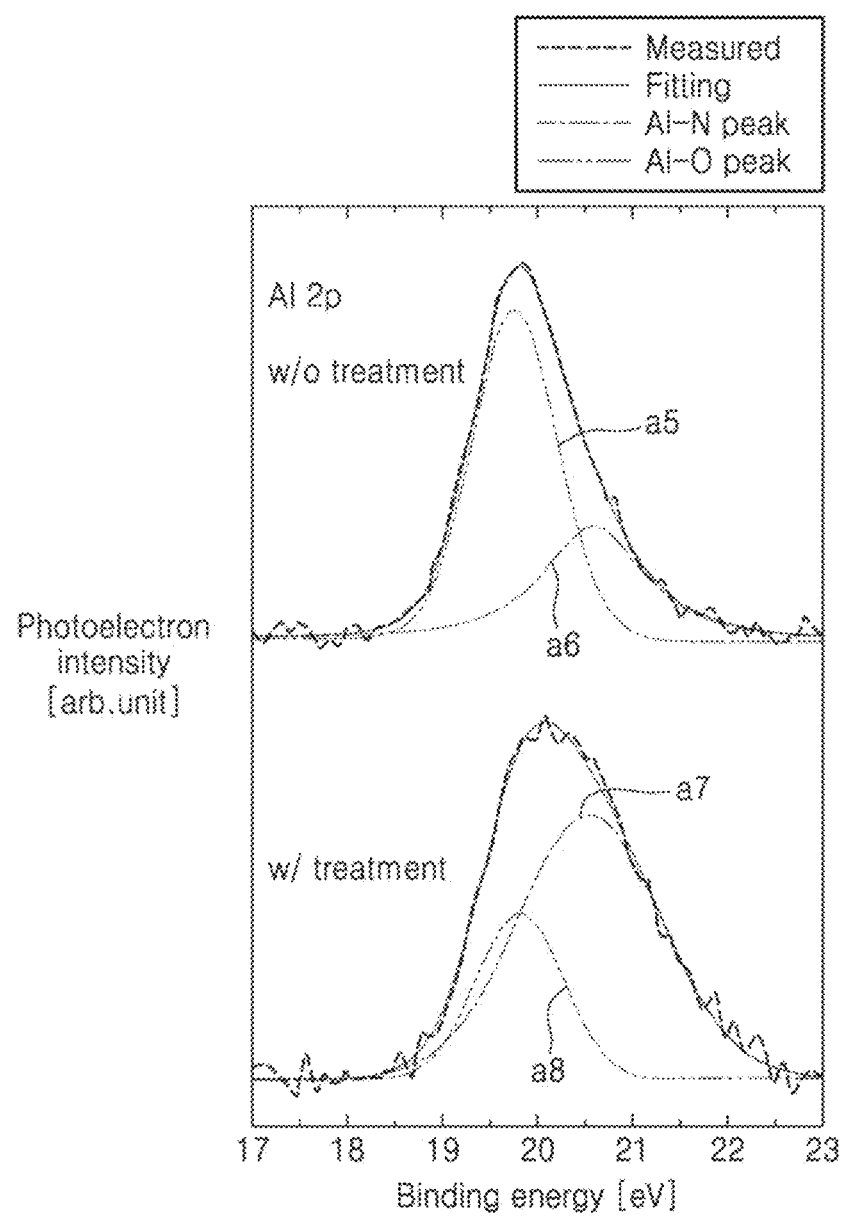
FIG. 3 is a graph schematically illustrating an XPS result with respect to a high electron mobility transistor according to an embodiment.
Figure 4:
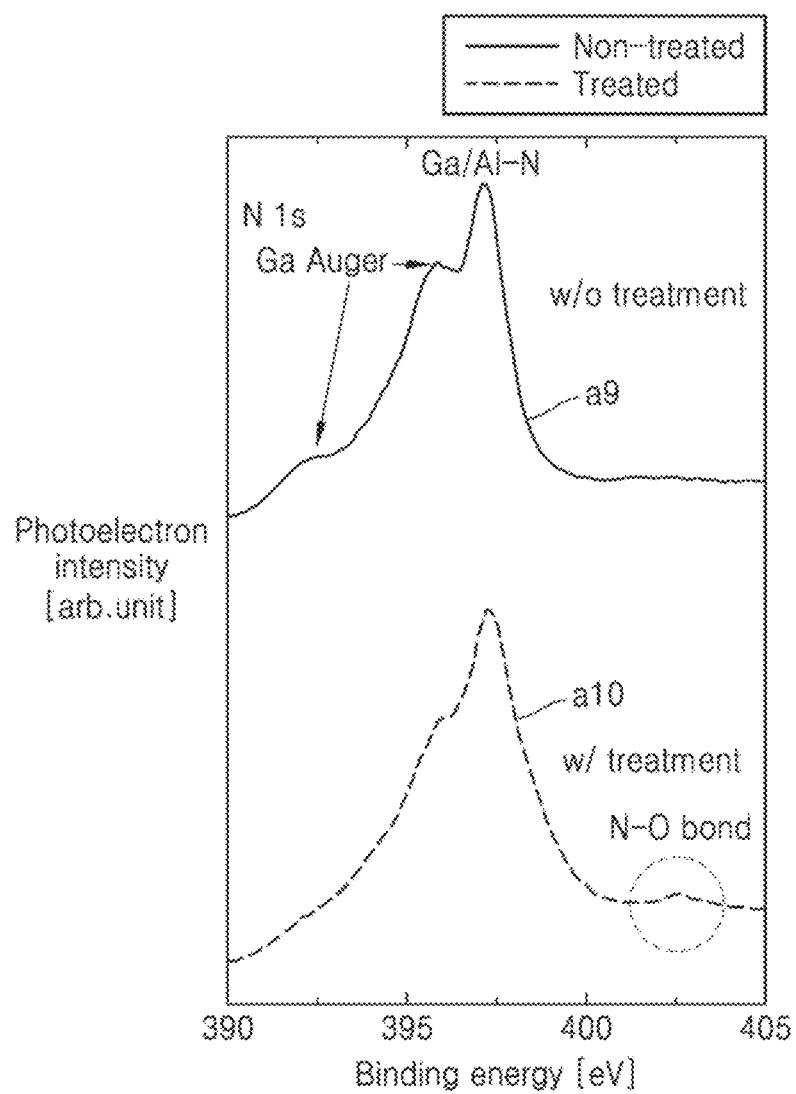
FIG. 4 is a graph schematically illustrating an XPS result with respect to a high electron mobility transistor according to an embodiment.
Figure 5:
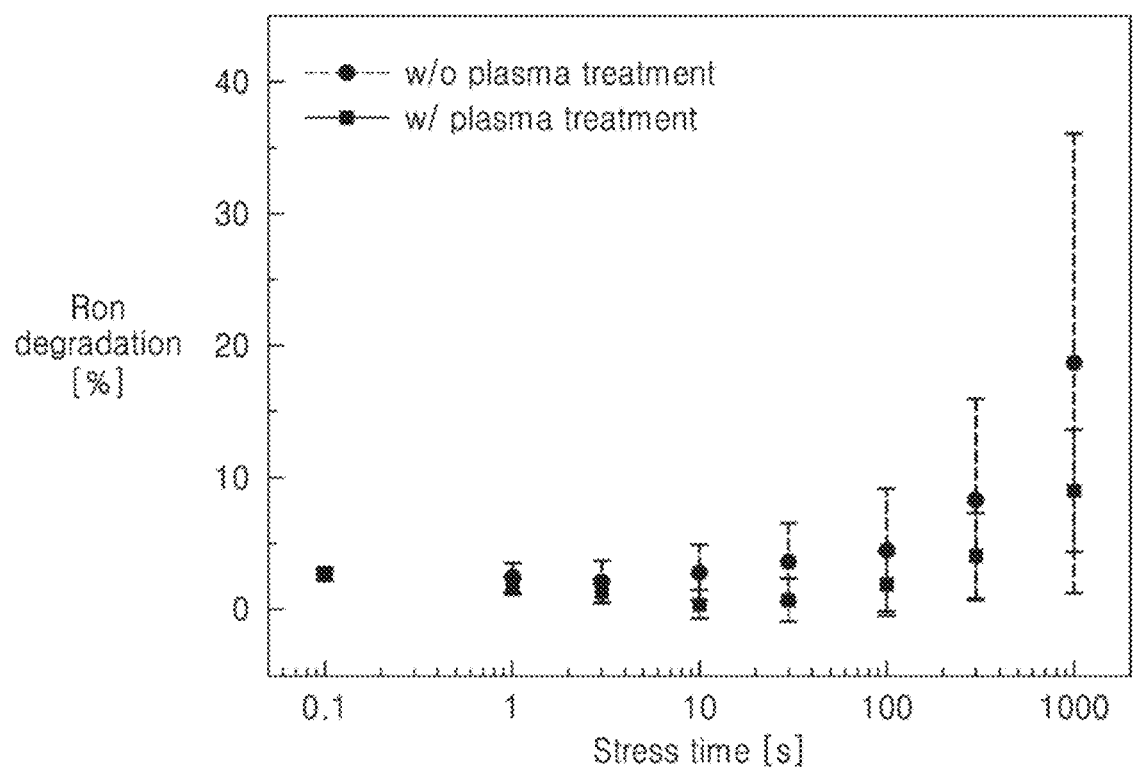
FIG. 5 is a schematic diagram illustrating a result of a high-temperature reverse bias (HTRB) reliability evaluation with respect to a high electron mobility transistor according to an embodiment.

FIG. 1 is a schematic side cross-sectional view of a configuration of a high electron mobility transistor 100 according to an embodiment. FIGS. 2 to 4 are graphs schematically illustrating an X-ray photoelectron spectroscopy (XPS) result with respect to the high electron mobility transistor 100 according to an embodiment. FIG. 5 is a schematic diagram illustrating a result of a HTRB reliability evaluation with respect to the high electron mobility transistor 100 according to an embodiment.

Referring to FIG. 1, the high electron mobility transistor 100 may include: a channel layer 20; a barrier layer 30 provided on the channel layer 20 and configured to induce formation of a two-dimensional electron gas (2DEG) in the channel layer 20; a p-type semiconductor layer 40 on the barrier layer 30; a first passivation layer 50 that is provided on the barrier layer 30 and includes a quaternary material of Al, Ga, O, and N; a gate electrode 60 on the p-type semiconductor layer 40; a source electrode 71 and a drain electrode 72 provided on both sides of the barrier layer 30 to be separated from the gate electrode 60. Also, the channel layer 20 may be provided on a structure in which a substrate 11, a seed layer 12, and a buffer layer 13 are sequentially stacked.

The substrate 11 may include, for example, sapphire, silicon (Si), silicon carbide (SiC), gallium nitride (GaN), or the like. The buffer layer 13 may be formed on the substrate 11. A desired and/or alternatively predetermined seed layer 12 may be provided between the substrate 11 and the buffer layer 13. The seed layer 12 may be a base layer for growing the buffer layer 13. For example, the seed layer 12 may include AlN. The substrate 11 and the buffer layer 13 may be removed after the high electron mobility transistor (HEMT) is formed.

The buffer layer 13 may mitigate a difference in a lattice constant and a thermal expansion coefficient between the substrate 11 and the channel layer 20 to prevent a decrease in crystallinity of the channel layer 20. The buffer layer 13 may have a single-layer or multi-layer structure including at least one material selected from nitrides including Group III-V materials, for example, at least one of Al, Ga, and In. The buffer layer 13 may include $Al_xIn_yGa_{1-x-y}N$ ($0 \le x \le 1$, $0 \le y \le 1$, $x+y \le 1$). The buffer layer 13 may have a single-layer or multi-layer structure including, for example, at least one of AlN, GaN, AlGaN, InGaN, AlInN, AlGaInN, and the like. The buffer layer 13 may include the same material as the channel layer 20.

The channel layer 20 is a layer forming a channel between the source electrode 71 and the drain electrode 72, and the channel layer 20 may include a material capable of forming a two-dimensional electron gas (2DEG) 21 therein. The channel layer 20 may have a single-layer or multi-layer structure including at least one material selected from nitrides including Group III-V materials, for example, at least one of Al, Ga, and In. The channel layer 20 may include $Al_xIn_yGa_{1-x-y}N$ ($0 \le x \le 1$, $0 \le y \le 1$, $x+y \le 1$). For example, the channel layer 20 may include at least one of AlN, GaN, InN, InGaN, AlGaN, AlInN, AlInGaN, and the like. The channel layer 20 may be an undoped layer or a layer doped with an impurity. The channel layer 20 may have a thickness of several hundred nm or less.

The barrier layer 30 may be formed on the channel layer 20. For example, the barrier layer 30 may be formed on a drift region DTA of the channel layer 20. The drift region DTA is a region between the source electrode 71 and the drain electrode 72, and is a region where carrier movement occurs when a potential difference is generated between the source electrode 71 and the drain electrode 72. As will be described later, carrier movement in the drift region DTA may be allowed/blocked and controlled according to whether a voltage is applied to the gate electrode 60 and/or a magnitude of the voltage applied to the gate electrode 60.

The barrier layer 30 may include a material having a greater energy bandgap than that of the channel layer 20. For example, the barrier layer 30 may have a multilayer structure including at least one material selected from Group III-V materials, for example, nitrides including at least one of Al, Ga, and In. The barrier layer 30 may include $Al_xIn_yGa_{1-x-y}N$ ($0 \le x \le 1$, $0 \le y \le 1$, $x+y \le 1$). The barrier layer 30 may include at least one of GaN, InN, AlGaN, AlInN, InGaN, AlN, and AlInGaN. The barrier layer 30 may be an undoped layer, but may also be a layer doped with a desired and/or alternatively predetermined impurity. The barrier layer 30 may have a thickness of several tens of nm or less. For example, the barrier layer 30 may have a thickness of about 50 nm or less.

Because the barrier layer 30 has a relatively high energy bandgap compared to the channel layer 20, the barrier layer 30 has a relatively high electrical polarizability. Accordingly, the 2DEG 21 is induced in the channel layer 20 provided under the barrier layer 30 and having a relatively low electrical polarization rate. The 2DEG 21 may be formed in a region of the channel layer 20 under an interface between the channel layer 20 and the barrier layer 30. The 2DEG 21 exhibits very high electron mobility.

The source electrode 71 and the drain electrode 72 may be formed on the channel layer 20. For example, the source electrode 71 and the drain electrode 72 may be formed to contact an upper surface of the channel layer 20. However, the present embodiment is not limited thereto, and unlike that shown in FIG. 1, the source electrode 71 and the drain electrode 72 may be formed to contact an upper surface of the barrier layer 30 on the channel layer 20.

The source electrode 71 and the drain electrode 72 may be formed outside the drift region DTA on the channel layer 20. For example, the source electrode 71 and the drain electrode 72 may be provided on both sides of the barrier layer 30. The source electrode 71 and the drain electrode 72 may be respectively formed in a source region SRA and a drain region DRA on the channel layer 20. The source electrode 71 and the drain electrode 72 may be in ohmic contact with the channel layer 20. The source electrode 71 and the drain electrode 72 may include an electrically conductive material, for example, a metal material. However, the present embodiment is not limited thereto, and the source electrode 71 and the drain electrode 72 may include various electrically conductive materials other than a metal material. The source electrode 71 and the drain electrode 72 may be provided to be separated from each other. The source electrode 71 and the drain electrode 72 may be separated from the gate electrode 60. The 2DEG 21 formed in the channel layer 20 may be used as a current passage between the source electrode 71 and the drain electrode 72, that is, a channel.

The p-type semiconductor layer 40 may be formed on the barrier layer 30. The p-type semiconductor layer 40 is positioned between the source electrode 71 and the drain electrode 72 to be separated from the source electrode 71 and the drain electrode 72. The p-type semiconductor layer 40 may be located closer to the source electrode 71 than the drain electrode 72. The p-type semiconductor layer 40 may have an energy bandgap different from that of the barrier layer 30. The p-type semiconductor layer 40 is a p-type semiconductor and may include Group III-V materials, for example, at least one material selected from nitrides including at least one of Al, Ga, and In. The p-type semiconductor layer 40 may include $Al_xIn_yGa_{1-x-y}N$ ($0 \leq x \leq 1$, $0 \leq y \leq 1$, $x+y \leq 1$). The p-type semiconductor layer 40 may include at least one of GaN, InN, AlGaN, AlInN, InGaN, AlN, and AlInGaN. The p-type semiconductor layer 40 may be doped with a p-type impurity, such as magnesium (Mg). For example, the p-type semiconductor layer 40 may include a p-GaN layer or a p-AlGaN layer.

Due to the p-type semiconductor layer 40, an energy band level of the barrier layer 30 is increased in a region (a gate region GTA) corresponding to a lower portion of the p-type semiconductor layer 40, and a depletion region 22 may be formed in a partial region of the drift region DTA of the channel layer 20, that is, the gate region GTA. Accordingly, carriers, that is, the 2DEG 21 may not form in the gate region GTA of the channel layer 20 or have a lower electron concentration than remaining regions. Accordingly, no current flows between the source electrode 71 and the drain electrode 72, and the high electron mobility transistor 100 has a normally-off characteristic. According to the normally-off characteristic, when no voltage is applied to the gate electrode 60, to be described later, that is, in a normal state, the channel layer 20 is in an off-state wherein a channel is cut-off by the 2DEG 21, and when a voltage is applied to the gate electrode 60, the channel layer 20 is in an on-state wherein the channel is formed by the 2DEG 21.

The gate electrode 60 may be formed on the p-type semiconductor layer 40. The gate electrode 60 is in ohmic or Schottky contact with the p-type semiconductor layer 40. The gate electrode 60 may include an electrically conductive material, for example, a metal material. However, the present embodiment is not limited thereto, and the gate electrode 60 may include various electrically conductive materials other than a metal material.

In a state that no voltage is applied to the gate electrode 60, the depletion region 22 is formed in the channel layer 20, and a channel by the 2DEG 21 is not formed. Accordingly, as shown in FIG. 1, the high electron mobility transistor 100 is in an off-state wherein no current flows from the source electrode 71 to the drain electrode 72.

When a voltage greater than or equal to a threshold voltage is applied to the gate electrode 60, the concentration of the 2DEG 21 in the gate region GTA of the channel layer 20 is increased, and a range of the 2DEG 21 is expanded, and thus, the depletion region 22 disappears and a channel is formed. Accordingly, the high electron mobility transistor 100 is in an on-state wherein current flows from the source electrode 71 to the drain electrode 72.

Meanwhile, the p-type semiconductor layer 40 may have a thickness, for example, in a range from about 30 nm to about 150 nm. When the thickness of the p-type semiconductor layer 40 is less than 30 nm, the depletion region 22 is not formed in the channel layer 20, and thus, a normally on characteristic wherein a current flows in an off-state may appear. When the thickness of the p-type semiconductor layer 40 exceeds 150 nm, an energy band level of the barrier layer 30 in the gate region GTA is too high, and in order to set the high electron mobility transistor to an on-state, a bias voltage applied to the gate electrode 60 may be excessively high.

In general, the high electron mobility transistor 100 used as a power device requires a high threshold voltage. In addition, in order to implement the high-electron mobility transistor 100 capable of high-speed operation, it is necessary to lower an on-resistance. A threshold voltage and an on-resistance may be controlled by changing the impurity concentration of the p-type semiconductor layer 40.

The first passivation layer 50 may be provided on the barrier layer 30. The first passivation layer 50 may be provided to directly contact an upper surface of the barrier layer 30. The first passivation layer 50 may be provided on a region of the barrier layer 30 where the p-type semiconductor layer 40 is not provided. For example, the first passivation layer 50 may be provided in remaining regions of the drift region DTA on the barrier layer 30, except for the gate region GTA. The first passivation layer 50 may have a thickness of several nm. For example, the first passivation layer 50 may have a thickness in a range from about 1 nm to about 10 nm.

The first passivation layer 50 may include a quaternary material of Al, Ga, O, and N. For example, the first passivation layer 50 may include $AlGaO_xN_y$, ($0<x<1$, $0<y<1$, $x+y<1$).

Reliability and uniformity of the high electron mobility transistor 100 may be increased by the first passivation layer 50. For example, the diffusion of gallium (Ga) from the barrier layer 30 to outside may be suppressed by the first passivation layer 50, and thus, a defect that may occur in the high electron mobility transistor 100 may be reduced. Also, because the first passivation layer 50 covers the barrier layer 30, the generation of dangling bonds on a surface of the high electron mobility transistor 100 may be suppressed, and a phenomenon of diffusing gallium (Ga) from the barrier layer 30 to outside may be suppressed.

Referring to FIG. 2, from a result of X-ray photoelectron spectroscopy (XPS) performed with respect to the high electron mobility transistor 100 including the first passivation layer 50 formed by an $N_2O$ plasma pretreatment performed on the barrier layer 30 including AlGaN, it may be seen that the high electron mobility transistor 100 includes greater Ga—O bonds than Ga—N bonds. For example, as shown in a first curve a1 and a second curve a2, before performing the $N_2O$ plasma pretreatment on the barrier layer 30, the high electron mobility transistor 100 may include greater Ga—N bonds than Ga—O bonds. Also, as shown in a third curve a3 and a fourth curve a4, after performing the $N_2O$ plasma pretreatment on the barrier layer 30, the high electron mobility transistor 100 may include greater Ga—O bonds than Ga—N bonds.

Referring to FIG. 3, from a result of XPS performed with respect to the high electron mobility transistor 100 including the first passivation layer 50 formed by an $N_2O$ plasma pretreatment performed on the barrier layer 30 including AlGaN, it may be seen that the high electron mobility transistor 100 includes greater Ga—O bonds than Al—N bonds. For example, as shown in a fifth curve a5 and a sixth curve a6, before performing the $N_2O$ plasma pretreatment on the barrier layer 30, the high electron mobility transistor 100 may include greater Al—N bonds than Al—O bonds. Also, as shown in a seventh curve a7 and an eighth curve a8, after performing the $N_2O$ plasma pretreatment on the barrier layer 30, the high electron mobility transistor 100 may include greater Al—O bonds than Al—N bonds.

Referring to FIG. 4, from a result of XPS performed with respect to the high electron mobility transistor 100 including the first passivation layer 50 formed by an $N_2O$ plasma pretreatment performed on the barrier layer 30 including AlGaN, it may be seen that the high electron mobility transistor 100 includes N—O bonds. For example, as shown in a ninth curve a9, the high electron mobility transistor 100 may not include an N—O bond before performing the $N_2O$ plasma pretreatment on the barrier layer 30. However, as shown in a tenth curve a10, after performing an $N_2O$ plasma pretreatment on the barrier layer 30, the high electron mobility transistor 100 may include an N—O bond.

As described with reference to FIGS. 2 to 4, when an $N_2O$ plasma pretreatment is performed on the barrier layer 30 including AlGaN, the first passivation layer 50 including a quaternary material of Al, Ga, N, and O may be formed in the high electron mobility transistor 100. However, the method of forming the first passivation layer 50 is not limited to the $N_2O$ plasma pretreatment, and the first passivation layer 50 may also be formed by an $O_2$ plasma pretreatment, an ozone treatment, or the like.

Referring to FIG. 5, an on-resistance Ron of the high electron mobility transistor 100 in the case when an $N_2O$ plasma pretreatment is not performed on the barrier layer 30 may be degraded to a greater extent than an on-resistance Ron of the high electron mobility transistor 100 in the case when an $N_2O$ plasma pretreatment is performed on the barrier layer 30. For example, when a stress of a drain-source voltage $V_{DS}$ of 700 V at 200° C. is applied to the high mobility transistor 100 for 1000 seconds, the on-resistance Ron of the high electron mobility transistor 100 in the case when an $N_2O$ plasma pretreatment is not performed may deteriorate by about 18.7%, and the on-resistance Ron of the high electron mobility transistor 100 in the case when an $N_2O$ plasma pretreatment is performed may be deteriorate by about 9.0%.

Furthermore, after forming a plurality of high electron mobility transistors 100 on a wafer, when an $N_2O$ plasma pretreatment is performed simultaneously on the barrier layer 30 of the plurality of high electron mobility transistors 100, the dispersion of the deterioration degree of the on-resistance Ron of the plurality of high electron mobility transistors 100 may be improved. For example, when a stress of a drain-source voltage $V_{DS}$ of 700 V at 200° C. is applied to each of the plurality of high mobility transistors 100 for 1,000 seconds, the dispersion of a deterioration degree of the on-resistance Ron of the high electron mobility transistor 100 in the case when an $N_2O$ plasma pretreatment is not performed may be about 17.4, and the dispersion of the deterioration degree of the on-resistance Ron of the high electron mobility transistor 100 in the case when an $N_2O$ plasma pretreatment is performed may be about 4.6.

Figure 6:
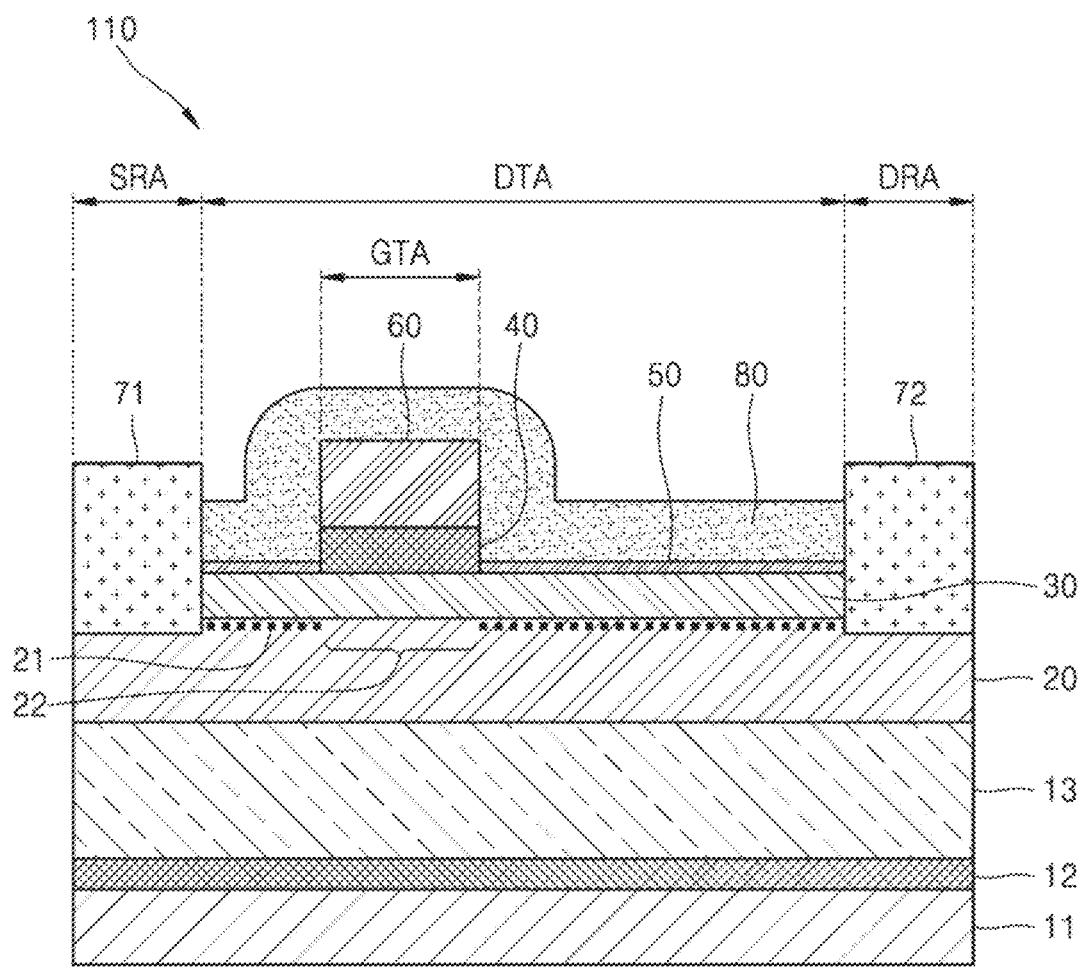
FIG. 6 is a schematic side cross-sectional view illustrating a configuration of a high electron mobility transistor according to another embodiment.

FIG. 6 is a schematic side cross-sectional view illustrating a configuration of a high electron mobility transistor 110 according to another embodiment.

The high electron mobility transistor 110 of FIG. 6 is substantially the same as the high electron mobility transistor 100 of FIG. 1 except that the second passivation layer 80 is further included. In the description of FIG. 6, descriptions previously given with reference to FIGS. 1 to 5 will be omitted.

Referring to FIG. 6, the high electron mobility transistor 110 may include: a channel layer 20; a barrier layer 30 on the channel layer 20 and configured to induce formation of a 2DEG in the channel layer 20; a p-type semiconductor layer 40 on the barrier layer 30; a first passivation layer 50 provided on the barrier layer 30 and including a quaternary material of Al, Ga, O, and N; a gate electrode 60 on the p-type semiconductor layer 40; and a source electrode 71 and a drain electrode 72 provided on both sides of the barrier layer 30 to be separated from the gate electrode 60. In addition, the channel layer 20 may be provided on a structure in which a substrate 11, a seed layer 12, and a buffer layer 13 are sequentially stacked.

In addition, the high electron mobility transistor 110 may further include a second passivation layer 80 covering the first passivation layer 50 and the gate electrode 60. The second passivation layer 80 may be provided to cover side surfaces of the gate electrode 60 and side surfaces of the p-type semiconductor layer 40. Both ends of the second passivation layer 80 may contact the source electrode 71 and the drain electrode 72, respectively. The second passivation layer 80 may include a material different from that of the first passivation layer 50. For example, the second passivation layer 80 may include any one of $SiO_2$, SiN, and $Al_2O_3$. However, the present embodiment is not limited thereto, and the second passivation layer 80 may include various kinds of insulating materials.

Figure 7:
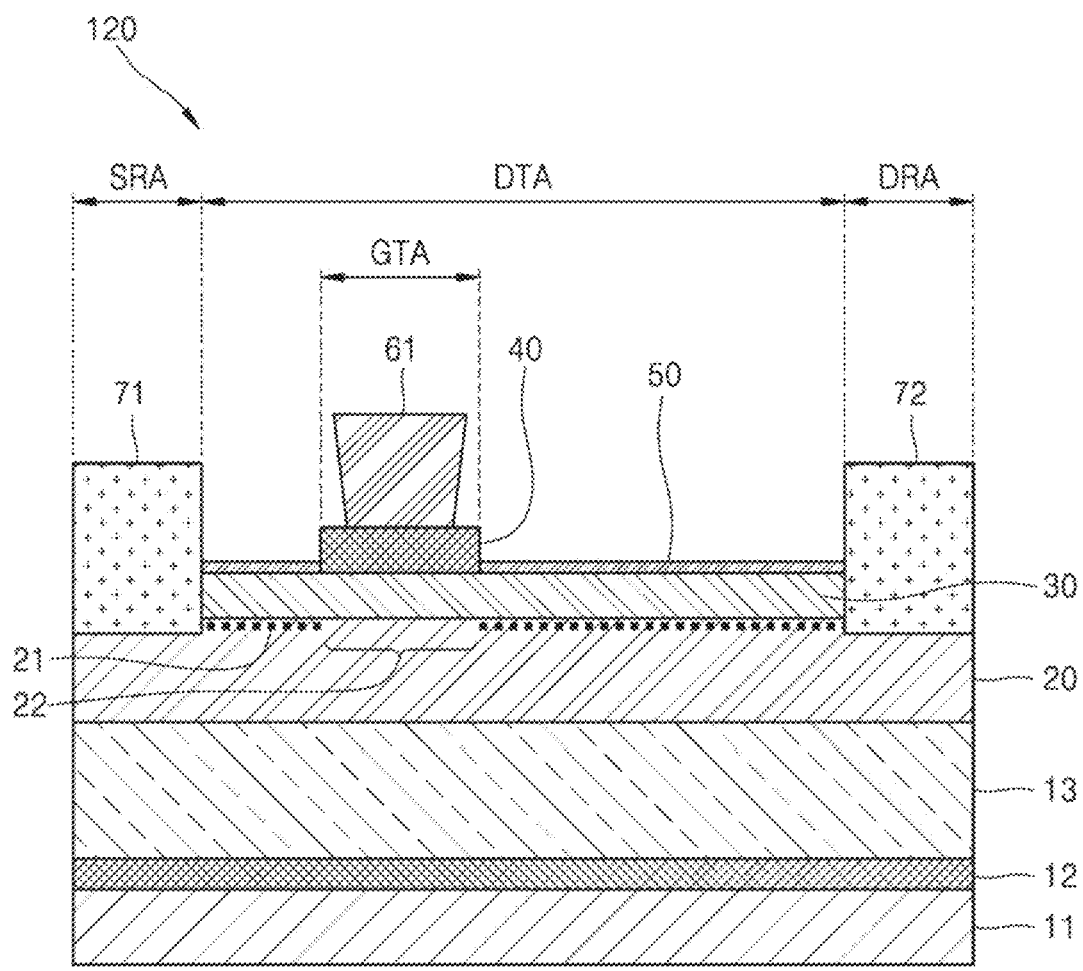
FIG. 7 is a schematic side cross-sectional view illustrating a configuration of a high electron mobility transistor according to another embodiment.

FIG. 7 is a schematic side cross-sectional view illustrating a configuration of a high electron mobility transistor 120 according to another embodiment.

The high electron mobility transistor 120 of FIG. 7 is substantially the same as the high electron mobility transistor 100 of FIG. 1, except that a gate electrode 61 has a different structure from the gate electrode 60 of FIG. 1. In the description of FIG. 7, descriptions previously given with reference to FIGS. 1 to 5 will be omitted.

Referring to FIG. 7, the high electron mobility transistor 120 may include: a channel layer 20; a barrier layer 30 on the channel layer 20 and configured to induce formation of a 2DEG in the channel layer 20; a p-type semiconductor layer 40 on the barrier layer 30; a first passivation layer 50 provided on the barrier layer 30 and including a quaternary material of Al, Ga, O, and N; a gate electrode 61 on the p-type semiconductor layer 40; and a source electrode 71 and a drain electrode 72 provided on both sides of the barrier layer 30 to be separated from the gate electrode 61. In addition, the channel layer 20 may be provided on a structure in which a substrate 11, a seed layer 12, and a buffer layer 13 are sequentially stacked.

The gate electrode 61 may have a tapered shape. For example, the gate electrode 61 may have a shape in which a width is gradually reduced from the top to the bottom. Accordingly, an area of an upper surface of the gate electrode 61 may be greater than that of a lower surface of the gate electrode 61 in contact with the p-type semiconductor layer 40. Also, the area of the lower surface of the gate electrode 61 in contact with the p-type semiconductor layer 40 may be less than that of an upper surface of the p-type semiconductor layer 40 in contact with the gate electrode 61.

Figure 8:
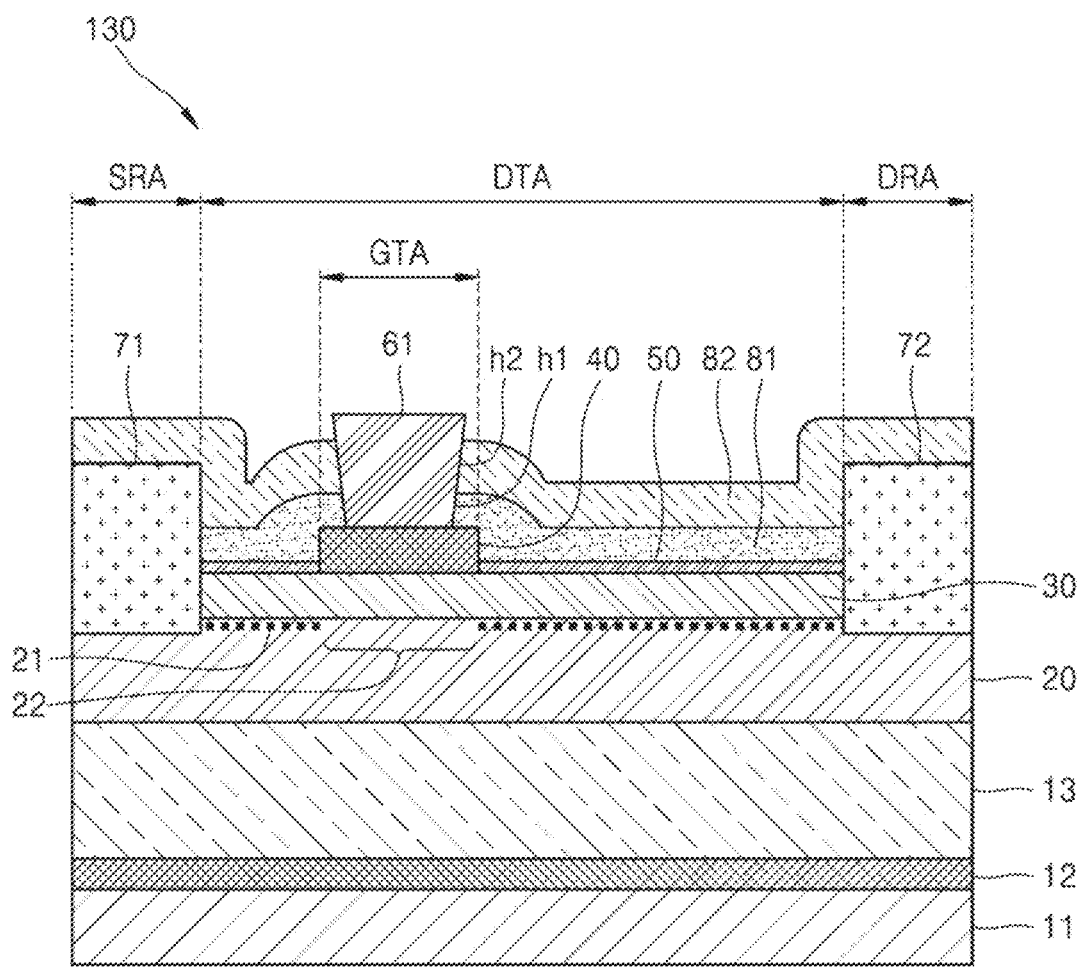
FIG. 8 is a schematic side cross-sectional view illustrating a configuration of a high electron mobility transistor according to another embodiment.

FIG. 8 is a schematic side cross-sectional view illustrating a configuration of a high electron mobility transistor 130 according to another embodiment.

The high electron mobility transistor 130 of FIG. 8 is substantially the same as the high electron mobility transistor 120 of FIG. 7 except that the high electron mobility transistor 130 further includes a second passivation layer 81 and a third passivation layer 82. In the description of FIG. 8, descriptions previously given with reference to FIGS. 1 to 5 will be omitted.

Referring to FIG. 8, the high electron mobility transistor 130 may include: a channel layer 20; a barrier layer 30 on the channel layer 20 and configured to induce formation of a 2DEG in the channel layer 20; a p-type semiconductor layer 40 on the barrier layer 30; a first passivation layer 50 provided on the barrier layer 30 and including a quaternary material of Al, Ga, O, and N; a gate electrode 61 on the p-type semiconductor layer 40; and a source electrode 71 and a drain electrode 72 provided on both sides of the barrier layer 30 to be separated from the gate electrode 61. In addition, the channel layer 20 may be provided on a structure in which a substrate 11, a seed layer 12, and a buffer layer 13 are sequentially stacked.

In addition, the high electron mobility transistor 130 may further include a second passivation layer 81 covering the first passivation layer 50 and the gate electrode 61. The second passivation layer 81 may be provided to cover side surfaces of the gate electrode 61 and side surfaces of the p-type semiconductor layer 40. Both ends of the second passivation layer 81 may contact the source electrode 71 and the drain electrode 72, respectively. The second passivation layer 81 may include a material different from that of the first passivation layer 50. For example, the second passivation layer 81 may include any one of $SiO_2$, SiN, and $Al_2O_3$. However, the present embodiment is not limited thereto, and the second passivation layer 81 may include various types of insulating materials.

Furthermore, the high electron mobility transistor 130 may further include a third passivation layer 82 covering the second passivation layer 81, the source electrode 71, and the drain electrode 72. The third passivation layer 82 may be provided to cover side surfaces of the gate electrode 61. The third passivation layer 82 may cover both side surfaces and upper surfaces of the source electrode 71 and the drain electrode 72, respectively. The third passivation layer 82 may include a material different from that of the first passivation layer 50. For example, the third passivation layer 82 may include any one of $SiO_2$, SiN, and $Al_2O_3$. However, the present embodiment is not limited thereto, and the third passivation layer 82 may include various types of insulating materials.

The second passivation layer 81 and the third passivation layer 82 may each include a first hole h1 and a second hole h2 exposing the gate electrode 61 to outside. The first hole h1 and the second hole h2 may be connected to each other, and the gate electrode 61 may be in contact with the p-type semiconductor layer 40 through the first hole h1 and the second hole h2.

Figure 9:
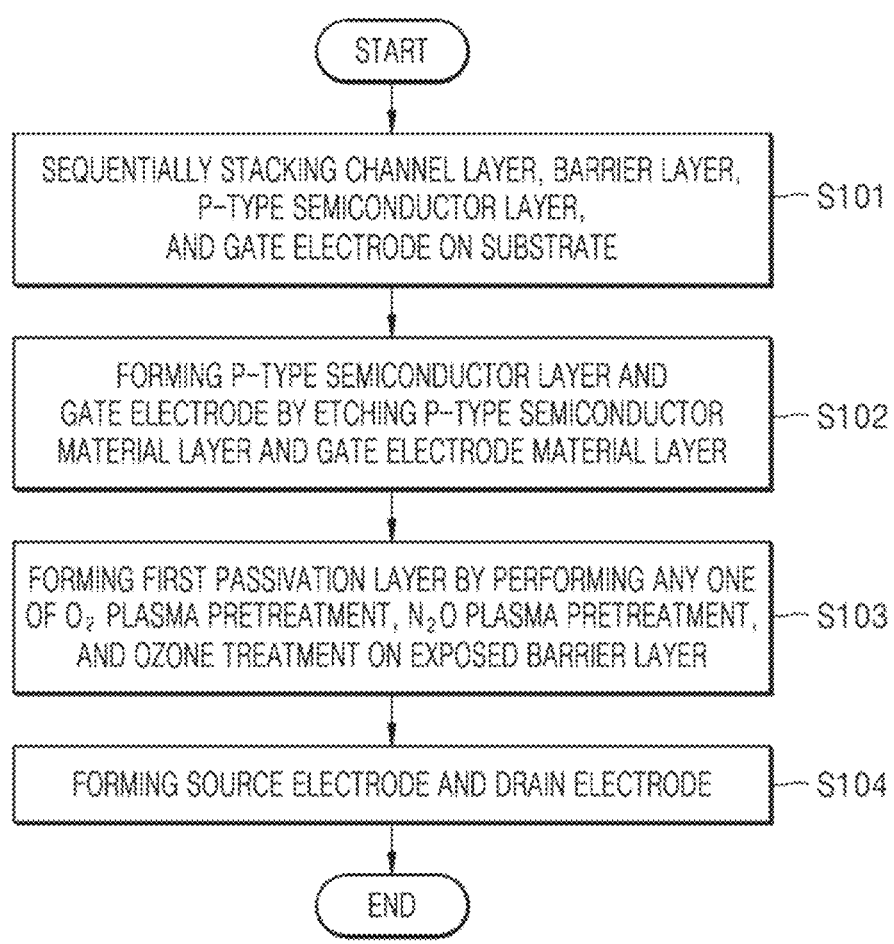
FIG. 9 is a flowchart illustrating a method of manufacturing a high electron mobility transistor according to an embodiment.

FIG. 9 is a flowchart illustrating a method of manufacturing a high electron mobility transistor 140 according to an embodiment. FIGS. 10 to 13 are cross-sectional views for explaining the method of manufacturing the high electron mobility transistor 140 of FIG. 9.

Referring to FIG. 9, the method of manufacturing the high electron mobility transistor 140 according to an embodiment may include: sequentially stacking a channel layer 20, a barrier layer 30, a p-type semiconductor material layer 41, and a gate electrode material layer 62 on a substrate 11 (S101); forming a p-type semiconductor layer 40 and a gate electrode 60 by etching the p-type semiconductor material layer 41 and the gate electrode material layer 62 (S102); forming a first passivation layer 50 by performing any one of an $O_2$ plasma pretreatment, an $N_2O$ plasma pretreatment, and an ozone treatment with respect to the exposed barrier layer 30 (S103); and forming a source electrode 71 and a drain electrode 72 on both sides of the barrier layer 30 (S104).

Figure 10:
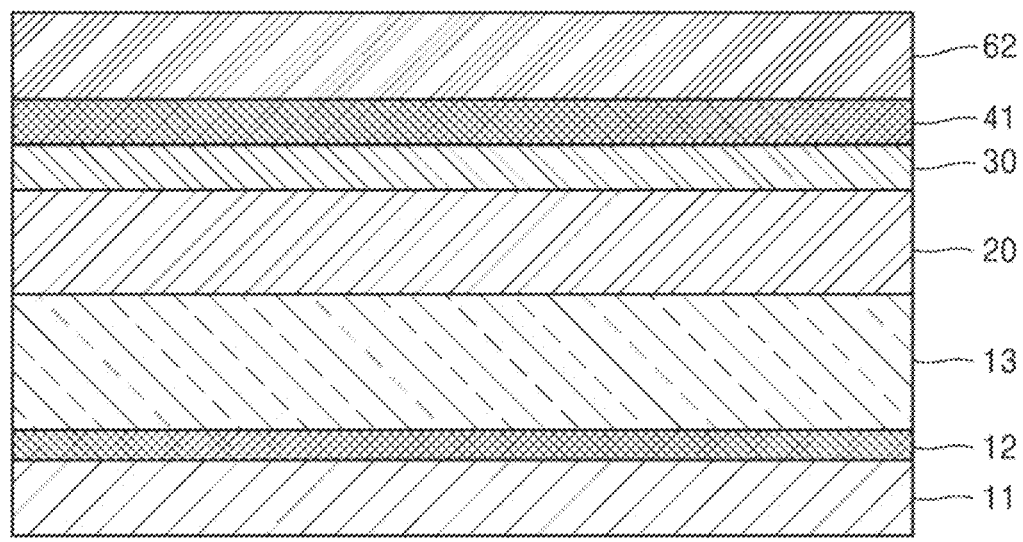
FIGS. 10 to 13 are cross-sectional views for explaining the method of manufacturing the high electron mobility transistor of FIG. 9.

Referring to FIG. 10, a seed layer 12, a buffer layer 13, the channel layer 20, and the barrier layer 30 may be sequentially formed on the substrate 11. Also, the p-type semiconductor material layer 41 and the gate electrode material layer 62 may be sequentially formed on the barrier layer 30.

Figure 11:
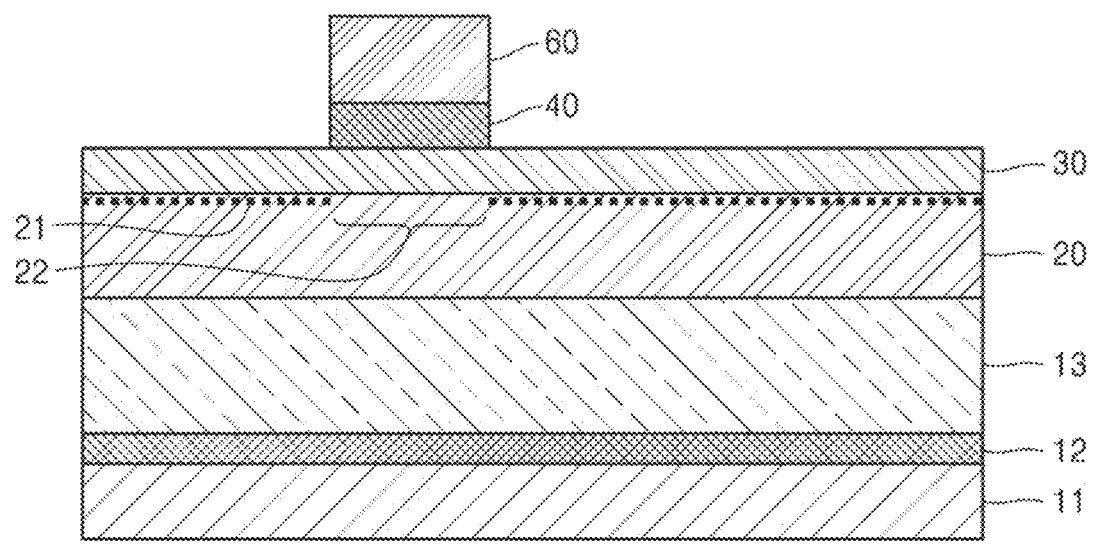

Referring to FIG. 11, the p-type semiconductor layer 40 and the gate electrode 60 may be formed by etching the p-type semiconductor material layer 41 and the gate electrode material layer 62 formed on the barrier layer 30. A 2DEG 21 may be generated in the channel layer 20 by the barrier layer 30. Also, a depletion region 22 may be formed in a portion of the channel layer 20 by the p-type semiconductor layer 40.

Figure 12:
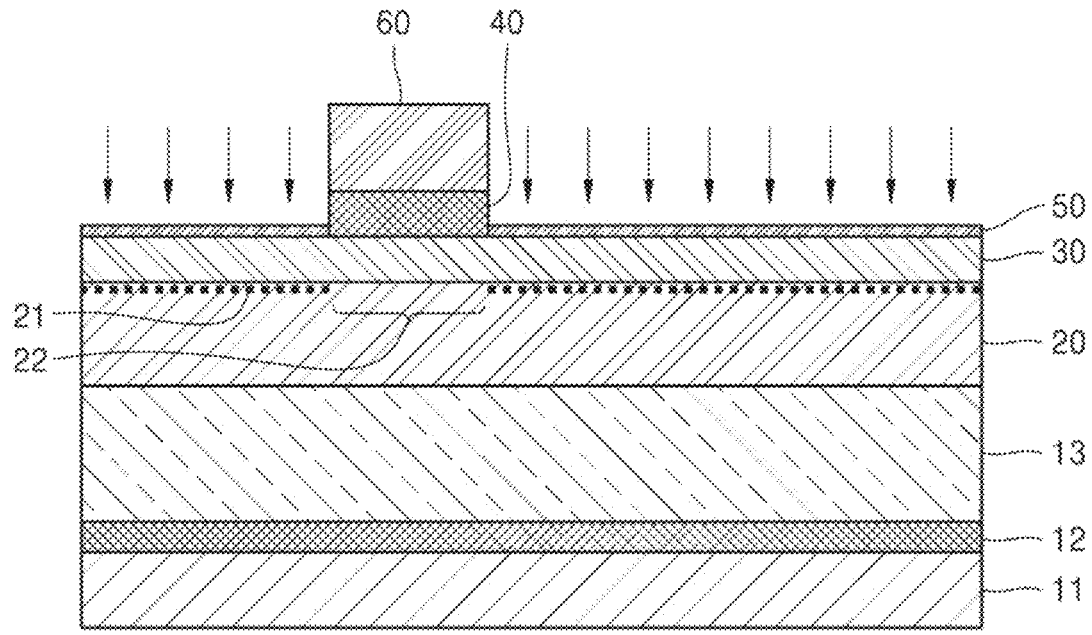

Referring to FIG. 12, the first passivation layer 50 including a quaternary material of Al, Ga, O, and N may be formed on the barrier layer 30 exposed by etching the p-type semiconductor material layer 41 and the gate electrode material layer 62. Any one of an $O_2$ plasma pretreatment, an $N_2O$ plasma pretreatment, and an ozone treatment may be performed with respect to the exposed barrier layer 30, and thus, the first passivation layer 50 may be formed. However, the method of forming the first passivation layer 50 is not limited thereto, and the first passivation layer 50 including a quaternary material of Al, Ga, O, and N may be formed by performing various treatments other than the treatments described above on the exposed barrier layer 30.

When the first passivation layer 50 is formed by performing the $N_2O$ plasma pretreatment on the exposed barrier layer 30, various types of the first passivation layer 50 may be formed by controlling a flow rate, pressure, plasma voltage, process temperature, and pretreatment time of $N_2O$. For example, the first passivation layer 50 may be formed by performing an $N_2O$ plasma pretreatment on the exposed barrier layer 30 by setting a flow rate of $N_2O$ to a range from about 10 sccm to about 2000 sccm, a pressure to a range from about 1.0 Torr to about 4.0 Torr, a plasma voltage to a range from about 50 W to about 200 W, a process temperature to a range from about 200° C. to about 500° C., and a pretreatment execution time to a range from about 30 seconds to 600 seconds.

For example, the first passivation layer 50 may be formed by performing an $N_2O$ plasma pretreatment on the exposed barrier layer 30 by setting, according to a first embodiment, the flow rate of $N_2O$ to about 1950 sccm, the pressure to about 2.7 Torr, the plasma voltage to 100 W, the process temperature to 400° C., and the pretreatment execution time to about 60 seconds.

For example, the first passivation layer 50 may be formed by performing an $N_2O$ plasma pretreatment on the exposed barrier layer 30 by setting, according to a second embodiment, the flow rate of $N_2O$ to about 1950 sccm, the pressure to about 2.7 Torr, the plasma voltage to 100 W, the process temperature to 400° C., and the pretreatment execution time to about 240 seconds.

For example, the first passivation layer 50 may be formed by performing an $N_2O$ plasma pretreatment on the exposed barrier layer 30 by setting, according to a third embodiment, the flow rate of $N_2O$ to about 1950 sccm, the pressure to about 2.7 Torr, the plasma voltage to 100 W, the process temperature to 400° C., and the pretreatment execution time to about 420 seconds.

For example, the first passivation layer 50 may be formed by performing an $N_2O$ plasma pretreatment on the exposed barrier layer 30 by setting, according to a fourth embodiment, the flow rate of $N_2O$ to about 800 sccm, the pressure to about 3.5 Torr, the plasma voltage to 80 W, the process temperature to 400° C., and the pretreatment execution time to about 240 seconds.

For example, the first passivation layer 50 may be formed by performing an $N_2O$ plasma pretreatment on the exposed barrier layer 30 by setting, according to a fifth embodiment, the flow rate of $N_2O$ to about 800 sccm, the pressure to about 3.5 Torr, the plasma voltage to 80 W, the process temperature to 400° C., and the pretreatment execution time to about 420 seconds.

Figure 13:
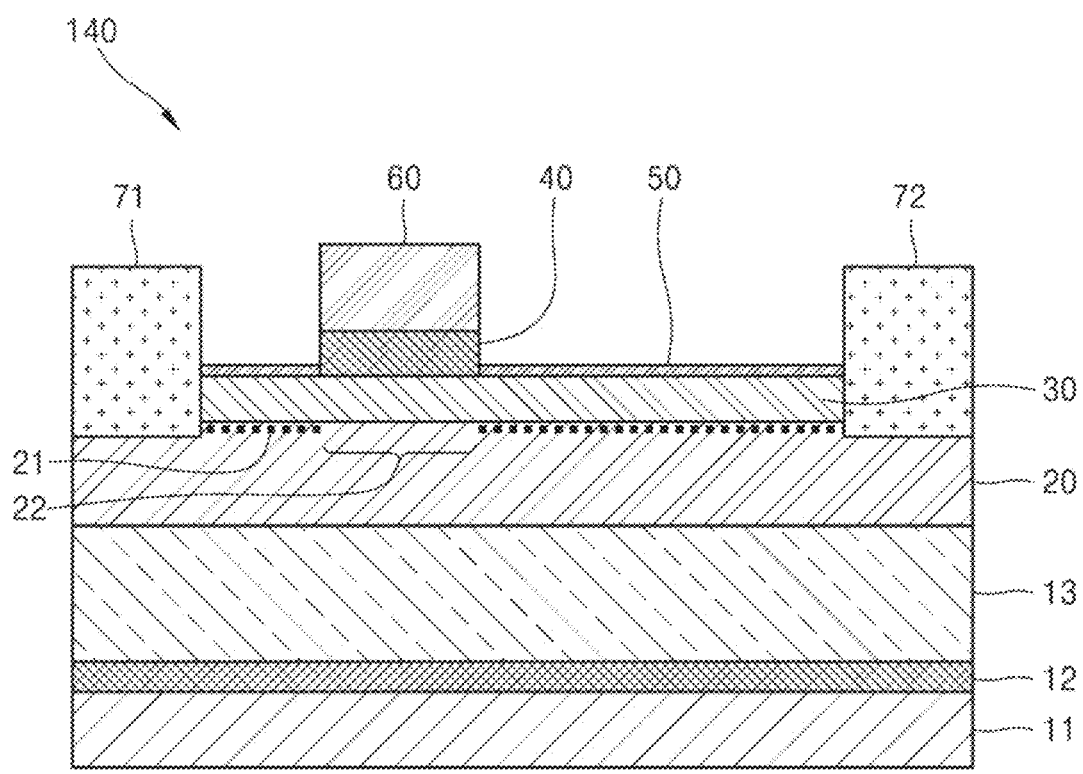

Referring to FIG. 13, the source electrode 71 and the drain electrode 72 may be formed on both sides of the barrier layer 30. The source electrode 71 and the drain electrode 72 may be formed on the channel layer 20. For example, the channel layer 20 may be exposed to outside by etching a portion of the barrier layer 30 and the first passivation layer 50. The source electrode 71 and the drain electrode 72 may be formed on the channel layer 20 exposed to outside. Accordingly, the source electrode 71 and the drain electrode 72 may be formed to contact an upper surface of the channel layer 20. However, the present embodiment is not limited thereto, and unlike that shown in FIG. 13, the barrier layer 30 is not etched, but after etching a portion of the first passivation layer 50, the source electrode 71 and the drain electrode 72 may be formed on an exposed upper surface of the barrier layer 30. Accordingly, the source electrode 71 and the drain electrode 72 may be formed to contact the upper surface of the barrier layer 30.

According to the method described with reference to FIGS. 9 to 13, the high electron mobility transistor 140 may be manufactured.

Figure 14:
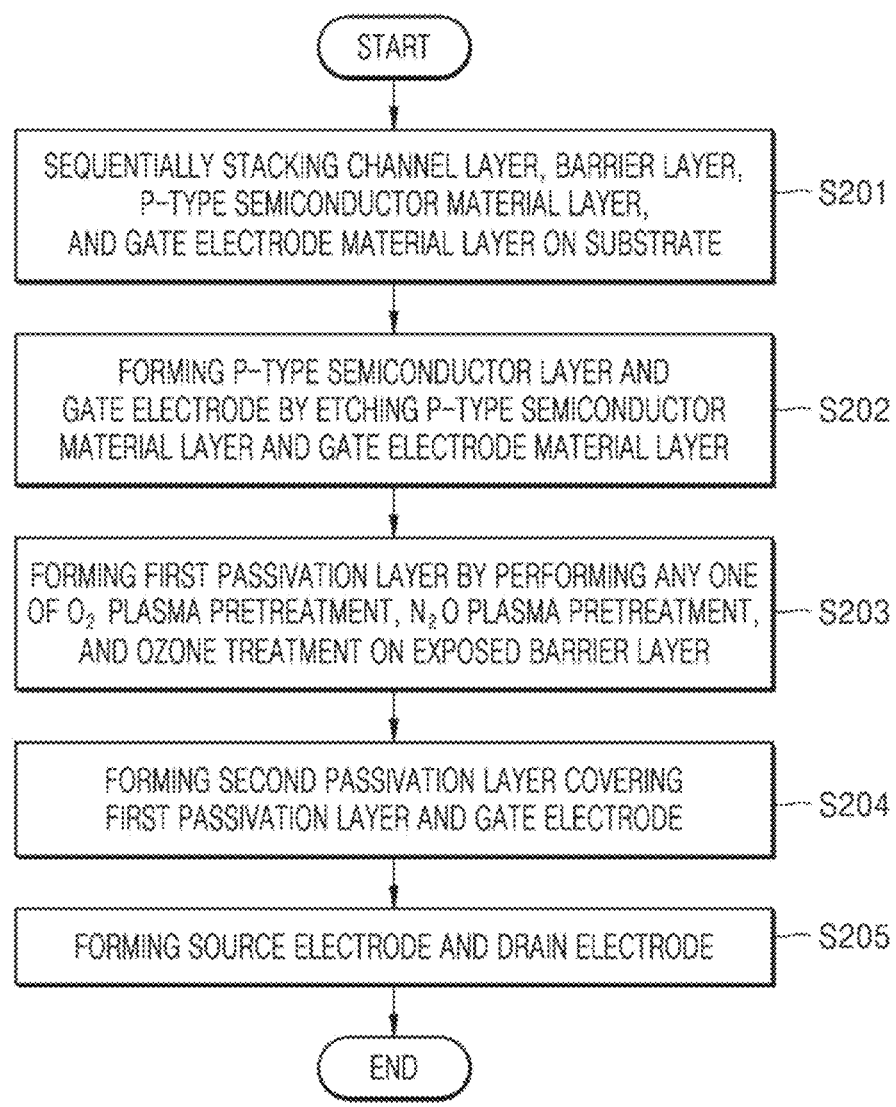
FIG. 14 is a flowchart illustrating a method of manufacturing a high electron mobility transistor according to another embodiment.
Figure 15:
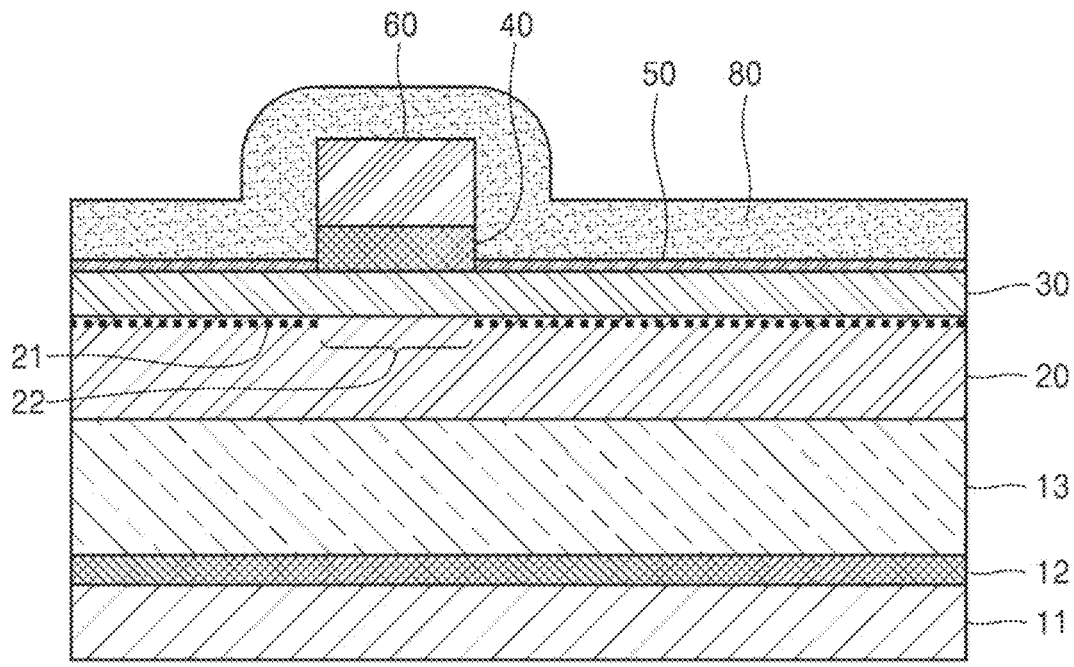
FIGS. 15 to 16 are cross-sectional views for explaining a method of manufacturing the high electron mobility transistor of FIG. 14.
Figure 16:
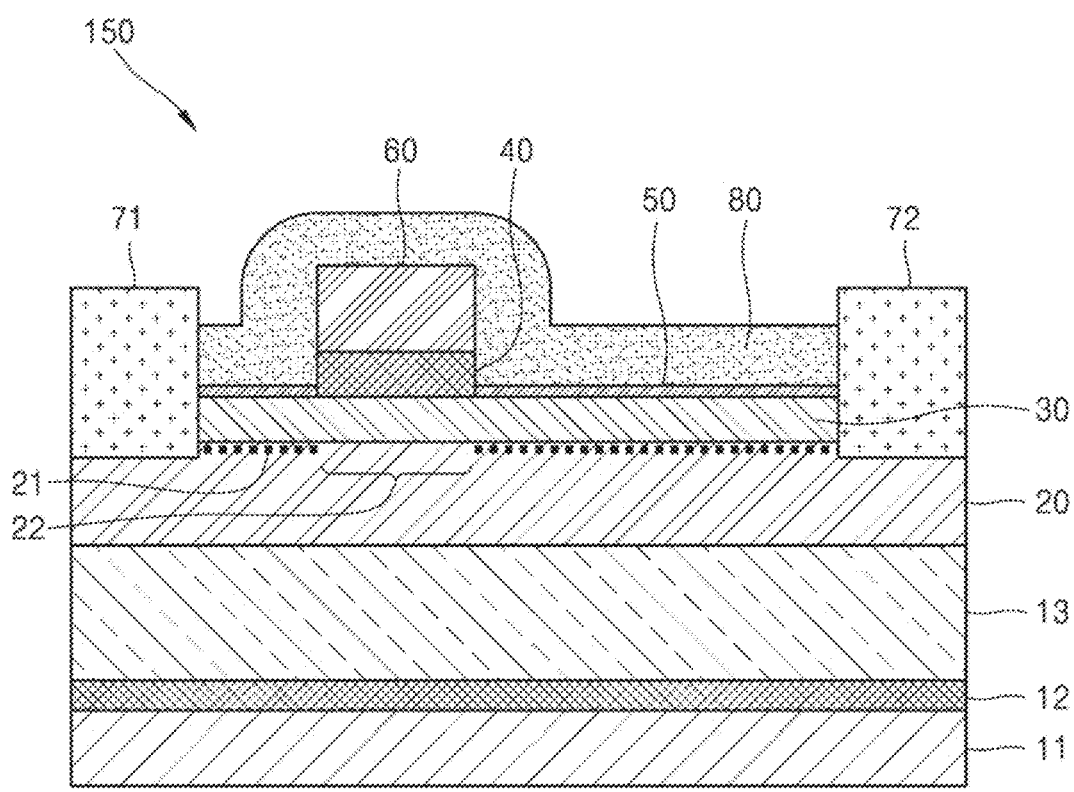

FIG. 14 is a flowchart illustrating a method of manufacturing a high electron mobility transistor 150 according to another embodiment. FIGS. 15 and 16 are cross-sectional views for explaining the method of manufacturing the high electron mobility transistor 150 of FIG. 14.

The method of manufacturing the high electron mobility transistor 150 of FIG. 14 may be substantially the same as the method of manufacturing the high electron mobility transistor 140 of FIG. 9 except that the method of forming the high electron mobility transistor 150 further includes forming (S204) a second passivation layer 80 covering the first passivation layer 50 and the gate electrode 60. In the description of FIGS. 14 to 16, descriptions previously given with reference to FIGS. 9 to 13 will be omitted.

Referring to FIG. 14, the method of manufacturing the high electron mobility transistor 150 according to another embodiment may include: sequentially stacking a channel layer 20, a barrier layer 30, a p-type semiconductor material layer 41, and a gate electrode material layer 62 on a substrate 11 (S201); forming a p-type semiconductor layer 40 and a gate electrode 60 by etching the p-type semiconductor material layer 41 and the gate electrode material layer 62 (S202); forming a first passivation layer 50 by performing any one of an $O_2$ plasma pretreatment, an $N_2O$ plasma pretreatment, and an ozone treatment on an exposed barrier layer 30 (S203); forming a second passivation layer 80 covering the first passivation layer 50 and the gate electrode 60 (S204); and forming a source electrode 71 and a drain electrode 72 on both sides of the barrier layer 30 (S205).

Referring to FIG. 15, after the first passivation layer 50 is formed, the second passivation layer 80 covering the first passivation layer 50 and the gate electrode 60 may be formed.

Referring to FIG. 16, the source electrode 71 and the drain electrode 72 may be formed on both sides of the barrier layer 30. The source electrode 71 and the drain electrode 72 may be formed on the channel layer 20. For example, portions of the barrier layer 30, the first passivation layer 50, and the second passivation layer 80 may be etched to expose the channel layer 20 to outside. The source electrode 71 and the drain electrode 72 may be formed on the channel layer 20 exposed to outside. Accordingly, the source electrode 71 and the drain electrode 72 may be formed to contact an upper surface of the channel layer 20. However, the present embodiment is not limited thereto, and unlike the one shown in FIG. 16, the barrier layer 30 is not etched, but after etching portions of the first passivation layer 50 and the second passivation layer 80, the source electrode 71 and the drain electrode 72 may be formed on an upper surface of the barrier layer 30 exposed to outside. Accordingly, the source electrode 71 and the drain electrode 72 may be formed to contact the upper surface of the barrier layer 30.

According to the method described with reference to FIGS. 14 to 16, the high electron mobility transistor 150 may be manufactured.

Figure 17:
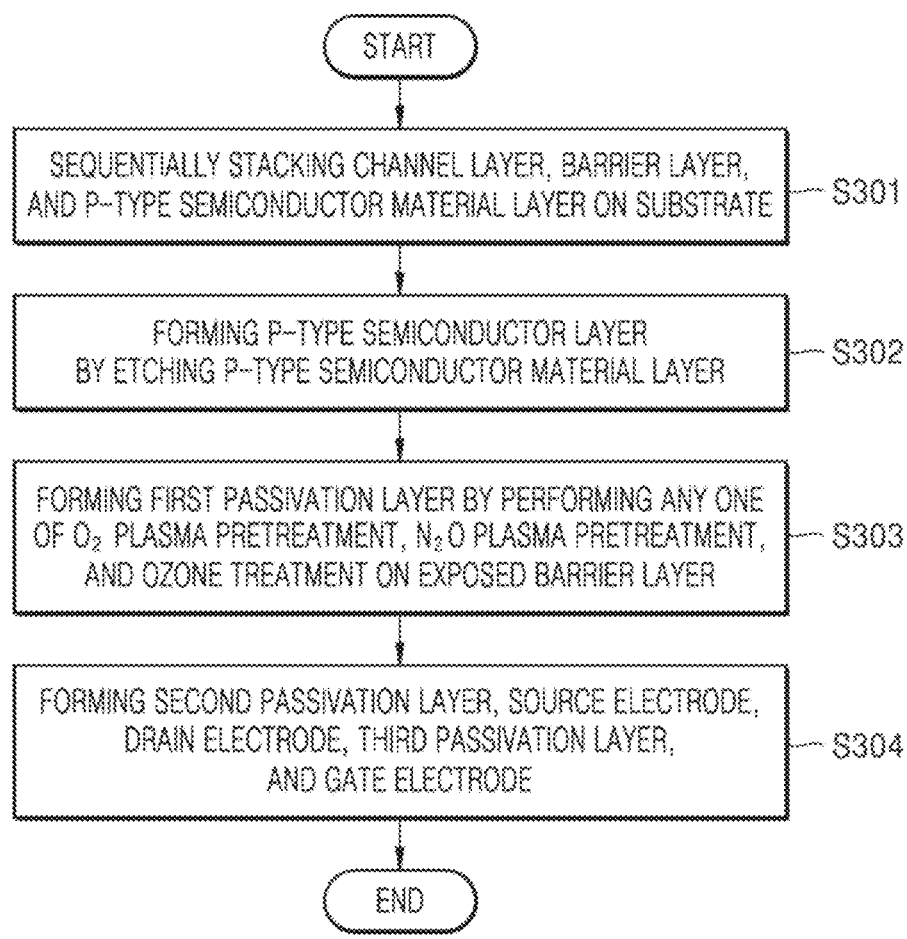
FIG. 17 is a flowchart illustrating a method of manufacturing a high electron mobility transistor according to another embodiment.
Figure 18:
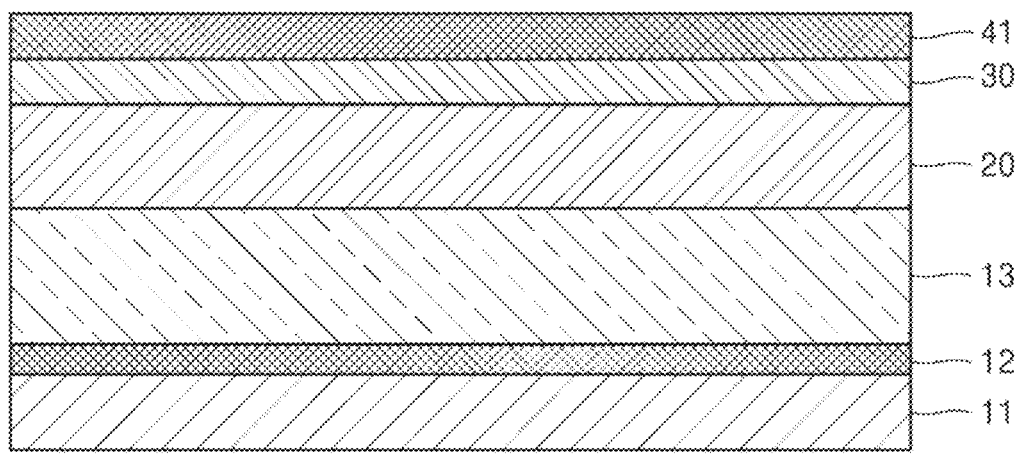
FIGS. 18 to 23 are cross-sectional view for explaining a method of manufacturing the high electron mobility transistor of FIG. 17.
Figure 23:
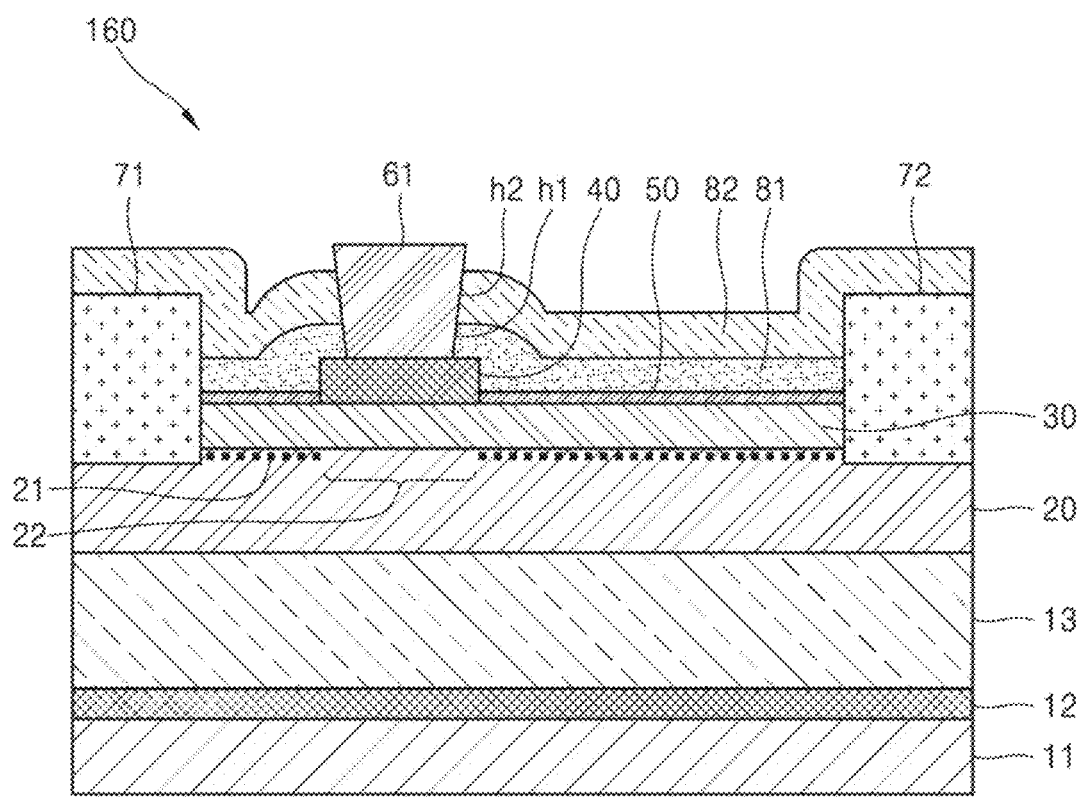

FIG. 17 is a flowchart illustrating a method of manufacturing a high electron mobility transistor 160 according to another embodiment. FIGS. 18 and 23 are cross-sectional views for explaining the method of manufacturing the high electron mobility transistor 160 of FIG. 17.

Referring to FIG. 17, the method of manufacturing the high electron mobility transistor 160 according to another embodiment may include: sequentially stacking a channel layer 20, a barrier layer 30, and a p-type semiconductor material layer 41 on a substrate 11 (S301); forming a p-type semiconductor layer 40 by etching the p-type semiconductor material layer 41 (S302); forming a first passivation layer 50 by performing any one of an $O_2$ plasma pretreatment, an $N_2O$ plasma pretreatment, and an ozone treatment on the exposed barrier layer 30 (S303); and forming a second passivation layer 81, a source electrode 71, a drain electrode 72, a third passivation layer 82 and a gate electrode 61 (S304).

Referring to FIG. 18, a seed layer 12, a buffer layer 13, the channel layer 20, and the barrier layer 30 may be sequentially formed on the substrate 11. In addition, the p-type semiconductor material layer 41 may be sequentially formed on the barrier layer 30.

Figure 19:
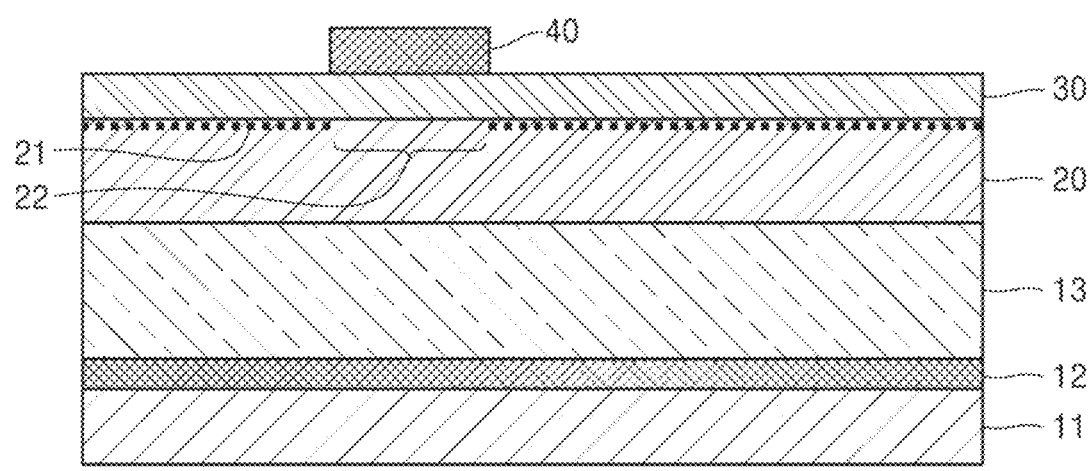

Referring to FIG. 19, the p-type semiconductor layer 40 may be formed by etching the p-type semiconductor material layer 41 formed on the barrier layer 30. A 2DEG 21 may be generated in the channel layer 20 by the barrier layer 30. Also, a depletion region 22 may be formed in a portion of the channel layer 20 by the p-type semiconductor layer 40.

Figure 20:
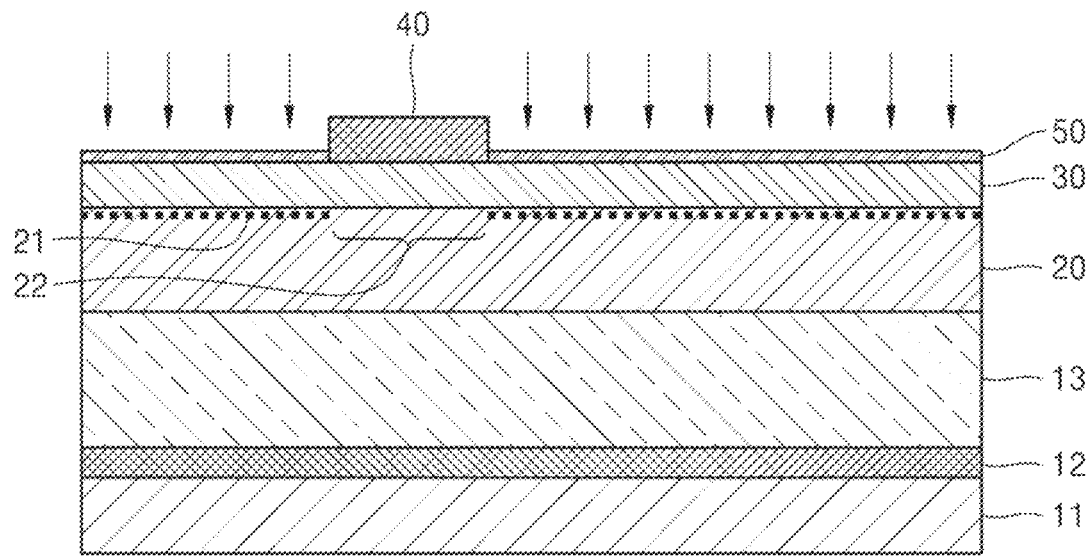

Referring to FIG. 20, the first passivation layer 50 including a quaternary material of Al, Ga, O, and N may be formed on the barrier layer 30 exposed by etching the p-type semiconductor material layer 41. Any one of an $O_2$ plasma pretreatment, an $N_2O$ plasma pretreatment, and an ozone treatment may be performed on the exposed barrier layer 30, and thus, the first passivation layer 50 may be formed. However, the method of forming the first passivation layer 50 is not limited thereto, and the first passivation layer 50 including a quaternary material of Al, Ga, 0, and N may be formed by performing various treatments other than the treatments described above on the exposed barrier layer 30.

Figure 21:
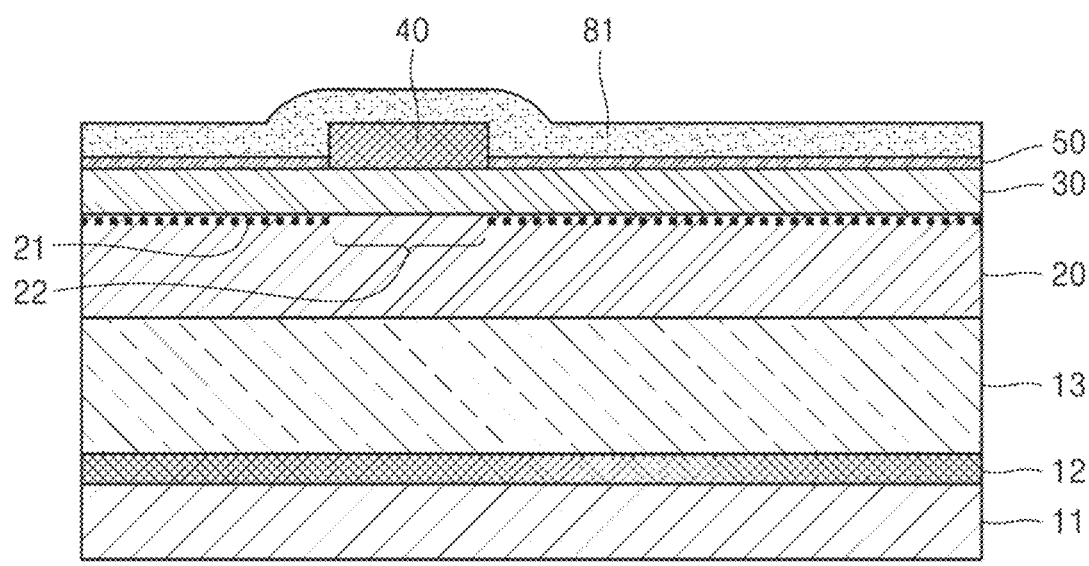

Referring to FIG. 21, after the first passivation layer 50 is formed, a second passivation layer 81 covering the first passivation layer 50 and the p-type semiconductor layer 40 may be formed.

Figure 22:
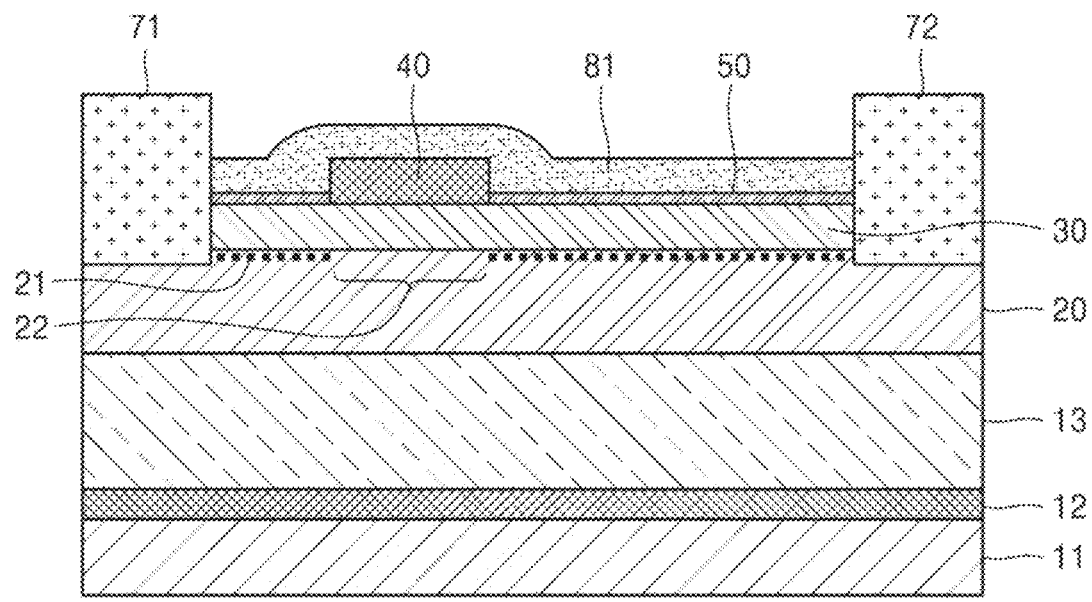

Referring to FIG. 22, the source electrode 71 and the drain electrode 72 may be formed on both sides of the barrier layer 30. The source electrode 71 and the drain electrode 72 may be formed on the channel layer 20. For example, portions of the barrier layer 30, the first passivation layer 50, and the second passivation layer 81 may be etched to expose the channel layer 20 to outside. The source electrode 71 and the drain electrode 72 may be formed on the channel layer 20 exposed to outside. Accordingly, the source electrode 71 and the drain electrode 72 may be formed to contact an upper surface of the channel layer 20. However, the present embodiment is not limited thereto, and unlike the one shown in FIG. 22, the barrier layer 30 is not etched, but after etching a portion of the first passivation layer 50 and the second passivation layer 81, the source electrode 71 and the drain electrode 72 may be formed on the exposed upper surface of the barrier layer 30. Accordingly, the source electrode 71 and the drain electrode 72 may be formed to contact the upper surface of the barrier layer 30.

Referring to FIG. 23, after the source electrode 71 and the drain electrode 72 are formed, a third passivation layer 82 covering the source electrode 71, the drain electrode 72, and the second passivation layer 81 may be formed. In addition, a first hole h1 and a second hole h2 exposing the p-type semiconductor layer 40 may be formed in the second passivation layer 81 and the third passivation layer 82, respectively, and a gate electrode 61 in contact with the p-type semiconductor layer 40 may be formed through the first hole h1 and the second hole h2.

According to the method described with reference to FIGS. 17 to 23, the high electron mobility transistor 160 may be manufactured.

According to various embodiments of the present disclosure, a high electron mobility transistor including a passivation layer of a quaternary material provided on a barrier layer and a method of manufacturing the same may be provided.

According to various embodiments of the present disclosure, a high electron mobility transistor including a passivation layer of a quaternary material that prevents deterioration of the high electron mobility transistor due to a dangling bond on a barrier layer and a method of manufacturing the same nay be provided.

According to various embodiments of the present disclosure, a high electron mobility transistor including a passivation layer of a quaternary material that prevents the diffusion of gallium (Ga) from a barrier layer and suppresses the formation of additional defects, and a method of manufacturing the same may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A high electron mobility transistor comprising:
a channel layer;
a barrier layer on the channel layer and configured to induce formation of a two-dimensional electron gas (2DEG) in the channel layer;
a p-type semiconductor layer on the barrier layer;
a first passivation layer on the barrier layer and including a quaternary material of Al, Ga, O, and N;
a gate electrode on the p-type semiconductor layer; and
a source electrode and a drain electrode on both sides of the barrier layer, respectively, and separated from the gate electrode, and
wherein the p-type semiconductor layer is interfaced with a top surface of the barrier layer.

2. The high electron mobility transistor of claim 1, wherein the first passivation layer includes $AlGaO_xN_y$, where $0<x<1$, $0<y<1$, and $x+y<1$.

3. The high electron mobility transistor of claim 1, wherein the first passivation layer is on a region of the barrier layer where the p-type semiconductor layer on the barrier layer is not provided.

4. The high electron mobility transistor of claim 1, wherein the first passivation layer is in direct contact with an upper surface of the barrier layer.

5. The high electron mobility transistor of claim 1, further comprising:
a second passivation layer covering the first passivation layer and the gate electrode.

6. The high electron mobility transistor of claim 5, wherein the second passivation layer includes a material different from that of the first passivation layer.

7. The high electron mobility transistor of claim 5, further comprising:
a third passivation layer covering the second passivation layer, the source electrode, and the drain electrode.

8. The high electron mobility transistor of claim 7, wherein the second passivation layer and the third passivation layer respectively include a first hole and a second hole exposing the gate electrode to outside.

9. The high electron mobility transistor of claim 7, wherein an area of a lower surface of the gate electrode in contact with the p-type semiconductor layer is less than an area of an upper surface of the p-type semiconductor layer in contact with the gate electrode.

10. The high electron mobility transistor of claim 1, wherein the first passivation layer has a thickness in a range from about 1 nm to about 10 nm, and
wherein the first passivation layer is composed of a single material composition.

11. The high electron mobility transistor of claim 1, wherein an energy bandgap of the barrier layer is greater than that of the channel layer, and
the p-type semiconductor layer includes magnesium (Mg).

12. The high electron mobility transistor of claim 1, wherein the barrier layer includes any one of AlGaN, AlInN, InGaN, AlN, and AlInGaN.

13. A method of manufacturing a high electron mobility transistor, the method comprising:
forming a channel layer on a substrate;
forming a barrier layer on the channel layer;
forming a p-type semiconductor layer on the barrier layer;
forming a first passivation layer including a quaternary material of Al, Ga, O, and N on the barrier layer;
forming a gate electrode on the p-type semiconductor layer; and
forming a source electrode and a drain electrode on both sides of the barrier layer, respectively, and separated from the gate electrode, and
wherein the p-type semiconductor layer is interfaced with a top surface of the barrier layer.

14. The method of claim 13, wherein in the forming the p-type semiconductor layer on the barrier layer and the forming the gate electrode on the p-type semiconductor layer, after sequentially forming a p-type semiconductor material layer and a gate electrode material layer on the barrier layer, the p-type semiconductor layer and the gate electrode are formed by etching a stack of the p-type semiconductor material layer and the gate electrode material layer, and the forming the first passivation layer is performed after the forming the p-type semiconductor layer and the forming the gate electrode.

15. The method of claim 14, wherein in the forming the first passivation layer, the first passivation layer is formed by performing any one of an $O_2$ plasma pretreatment, an $N_2O$ plasma pretreatment, and an ozone treatment on the barrier layer exposed by etching the p-type semiconductor material layer and the gate electrode material layer.

16. The method of claim 14, further comprising:
forming a second passivation layer covering the first passivation layer and the gate electrode after the forming the first passivation layer.

17. The method of claim 13, wherein in the forming the p-type semiconductor layer on the barrier layer, a p-type semiconductor material layer is formed on the barrier layer, and then the p-type semiconductor layer is formed by etching the p-type semiconductor material layer, and
in the forming the first passivation layer, the first passivation layer is formed by performing any one of an $O_2$ plasma pretreatment, an $N_2O$ plasma pretreatment, and an ozone treatment on the barrier layer exposed by etching the p-type semiconductor material layer.

18. The method of claim 17, further comprising:
after forming the first passivation layer and before the forming the gate electrode, forming a second passivation layer covering the first passivation layer and the p-type semiconductor layer.

19. The method of claim 18, further comprising:
forming a third passivation layer covering the source electrode, the drain electrode, and the second passivation layer, wherein
after the forming the second passivation layer and before the forming the gate electrode, the forming the source electrode and the forming the drain electrode is performed, and
the forming the third passivation layer is performed after the forming the source electrode and the forming the drain electrode and before the forming the gate electrode.

20. The method of claim 19, wherein in the forming the gate electrode, a first hole and a second hole for exposing the p-type semiconductor layer are formed in the second passivation layer and the third passivation layer, respectively, and the gate electrode in contact with the p-type semiconductor layer through the first hole and the second hole.

* * * * *